(12) United States Patent
Shen et al.

(10) Patent No.: US 11,125,070 B2
(45) Date of Patent: Sep. 21, 2021

(54) REAL TIME DRILLING MONITORING

(71) Applicant: Schlumberger Technology Corporation, Sugar Land, TX (US)

(72) Inventors: Yuelin Shen, Spring, TX (US); Wei Chen, Spring, TX (US); Gang Xu, Beijing (CN); Guishui Zheng, Beijing (CN); Rongbing Chen, Beijing (CN); Riadh Boualleg, Cambridge (GB); My Lien Ta, Aberdeen (GB); Gregg Alexander, Aberdeen (GB); Sujian Huang, Beijing (CN)

(73) Assignee: Schlumberger Technology Corporation, Sugar Land, TX (US)

( * ) Notice: Subject to any disclaimer, the term of this patent is extended or adjusted under 35 U.S.C. 154(b) by 315 days.

(21) Appl. No.: 15/572,172

(22) PCT Filed: May 4, 2016

(86) PCT No.: PCT/US2016/030623
§ 371 (c)(1),
(2) Date: Nov. 7, 2017

(87) PCT Pub. No.: WO2016/182799
PCT Pub. Date: Nov. 17, 2016

(65) Prior Publication Data
US 2018/0119535 A1 May 3, 2018

Related U.S. Application Data

(60) Provisional application No. 62/159,605, filed on May 11, 2015.

(30) Foreign Application Priority Data

May 8, 2015 (WO) ................ PCT/CN2015/078613

(51) Int. Cl.
*E21B 44/00* (2006.01)
*G06F 30/20* (2020.01)
*E21B 47/007* (2012.01)
*E21B 41/00* (2006.01)
(Continued)

(52) U.S. Cl.
CPC .......... *E21B 44/00* (2013.01); *E21B 41/0092* (2013.01); *E21B 45/00* (2013.01);
(Continued)

(58) Field of Classification Search
CPC ...... E21B 10/26; E21B 41/0092; E21B 44/00; E21B 45/00; E21B 47/0006; E21B 7/04; G06F 17/5009
See application file for complete search history.

(56) References Cited

U.S. PATENT DOCUMENTS 5,159,577 A * 10/1992 Twist ...................... G01V 1/22
367/25
8,170,800 B2 * 5/2012 Aamodt ................. E21B 44/00
702/9
(Continued)

FOREIGN PATENT DOCUMENTS

| CN | 203134246 U | 8/2013 |
| WO | WO2007147135 A2 | 12/2007 |
| WO | WO2014158706 A1 | 10/2014 |

OTHER PUBLICATIONS

International Search Report and Written Opinion issued in International Patent application PCT/CN2015/078613, dated Feb. 2, 2012. 11 pages.
(Continued)

*Primary Examiner* — Rehana Perveen
*Assistant Examiner* — Steven W Crabb
(74) *Attorney, Agent, or Firm* — Alec J. McGinn

(57) ABSTRACT

A method, system, and computer readable medium for managing drilling operations include calibrating a drilling
(Continued)

model using collected drilling data, and executing, during a drilling operation, a simulation on the drilling model to generate a predicted measurement value for a drilling property. During the drilling operation and from a drillstring, an actual measurement value for the drilling property is obtained. Based on the actual measurement value matching the predicted measurement value, the simulation is extended to generate a simulated state of the drilling operation during the drilling operation, and a condition of the drilling operation is detected. A notification may be presented based on the condition during the drilling operation.

23 Claims, 17 Drawing Sheets

(51) Int. Cl.
*E21B 45/00* (2006.01)
*E21B 7/04* (2006.01)
*E21B 10/26* (2006.01)

(52) U.S. Cl.
CPC ............ *E21B 47/007* (2020.05); *G06F 30/20* (2020.01); *E21B 7/04* (2013.01); *E21B 10/26* (2013.01)

(56) References Cited

U.S. PATENT DOCUMENTS

| | | | |
|---|---|---|---|
| 8,830,232 B2* | 9/2014 | Rothnemer | E21B 44/00 345/419 |
| 2002/0120401 A1* | 8/2002 | Macdonald | E21B 44/005 702/6 |
| 2004/0154831 A1 | 8/2004 | Seydoux et al. | |
| 2008/0179094 A1 | 7/2008 | Repin et al. | |
| 2009/0152005 A1 | 6/2009 | Chapman et al. | |
| 2011/0186353 A1 | 8/2011 | Turner et al. | |
| 2014/0182934 A1* | 7/2014 | Samuel | E21B 44/04 175/40 |
| 2014/0262246 A1 | 9/2014 | Li et al. | |
| 2015/0083492 A1* | 3/2015 | Wassell | E21B 41/00 175/24 |

OTHER PUBLICATIONS

International Search Report and Written Opinion issued in International Patent application PCT/US2016/030623, dated Aug. 3, 2016. 13 pages.

* cited by examiner

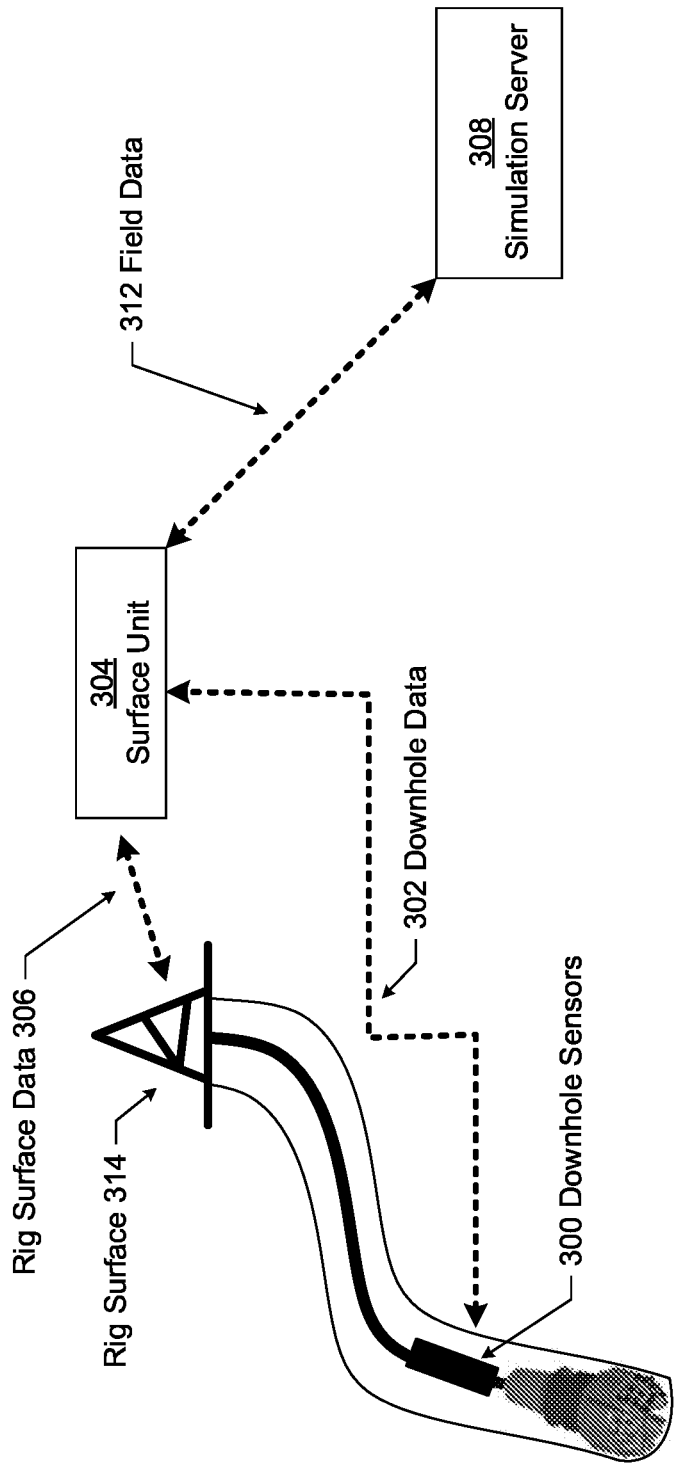
FIG. 3.1

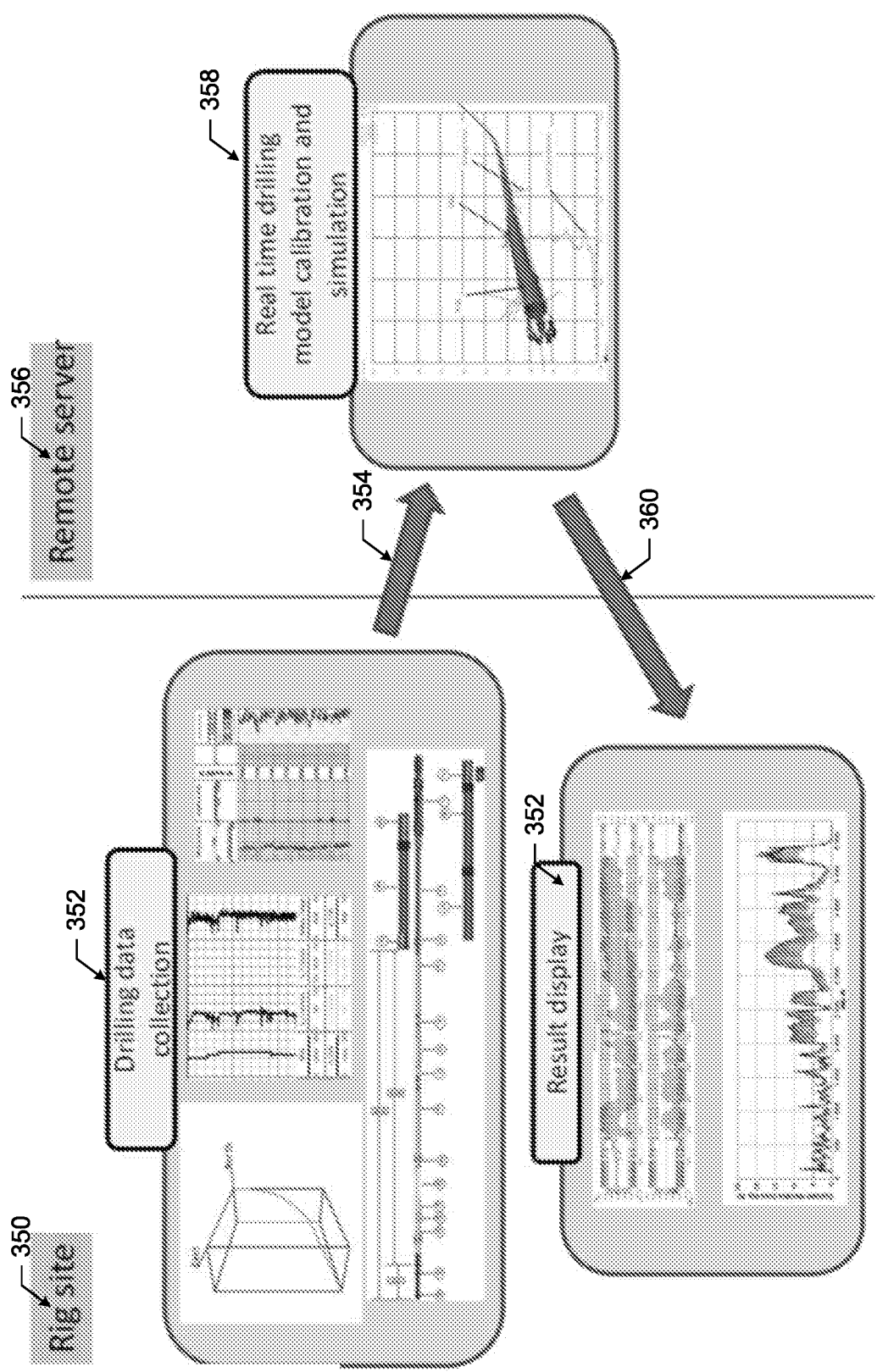
FIG. 3.2

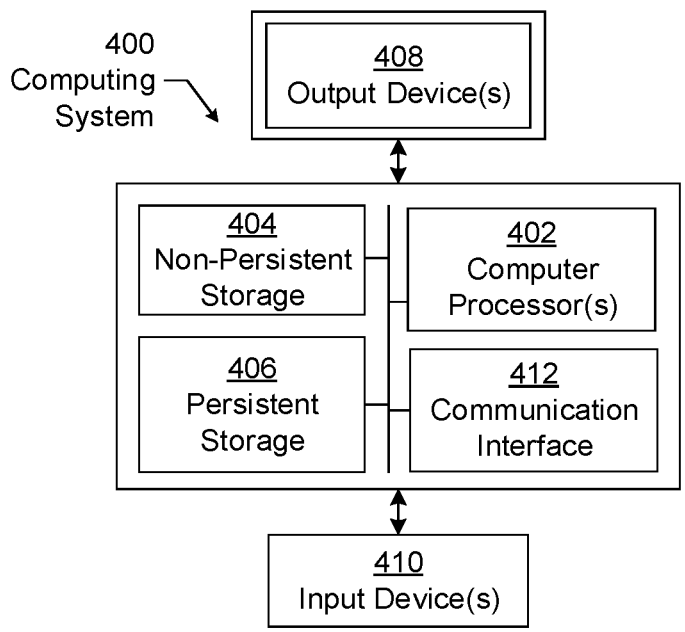
FIG. 4.1
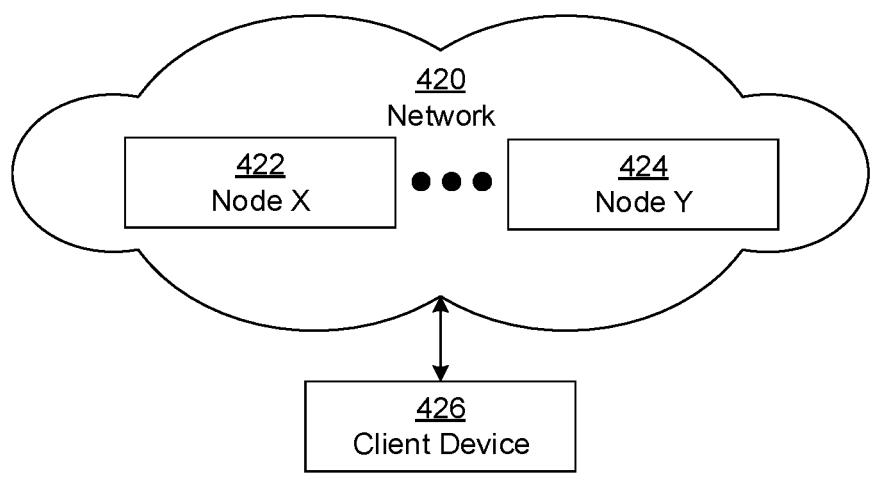
FIG. 4.2

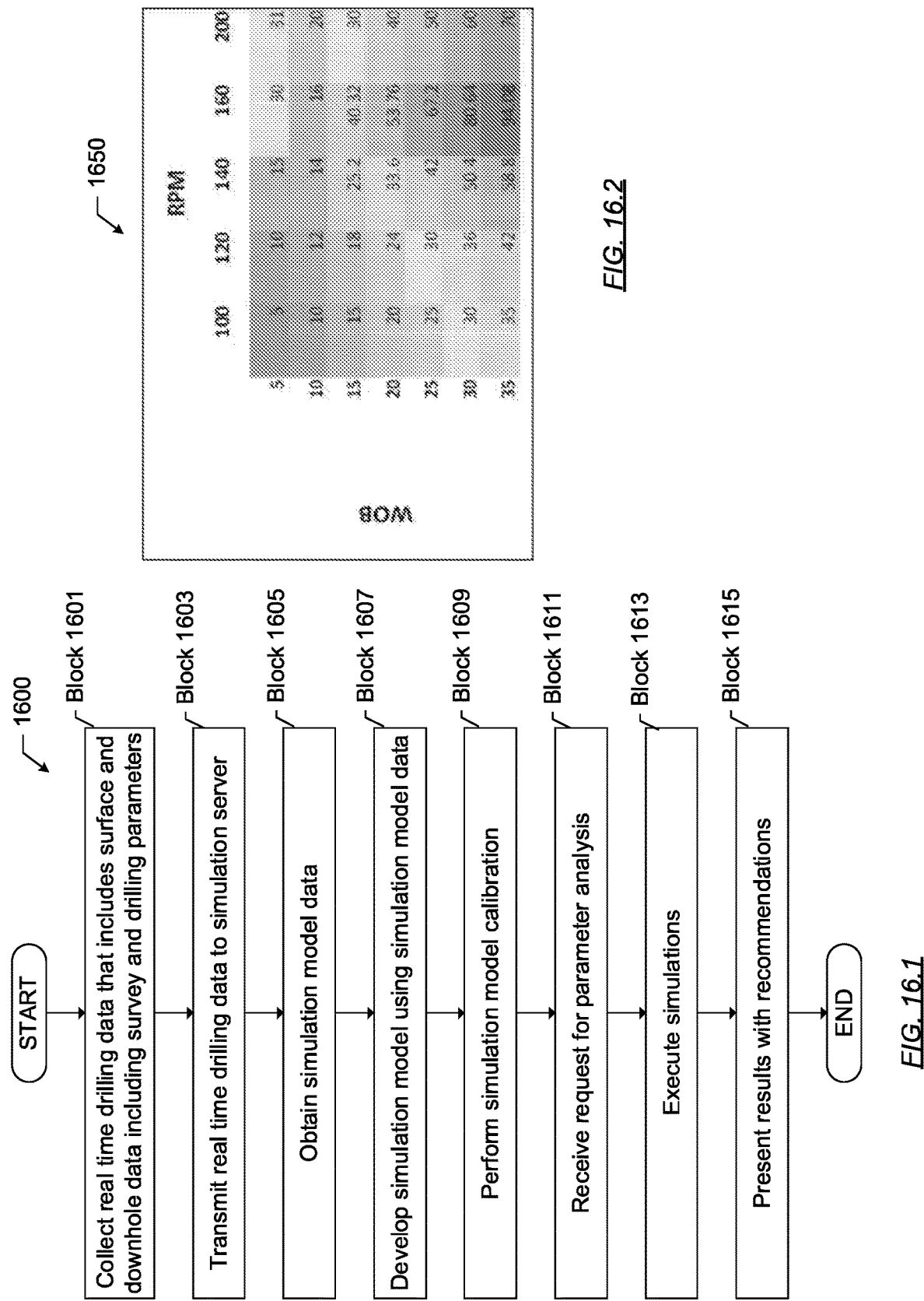

REAL TIME DRILLING MONITORING

CROSS-REFERENCE TO RELATED APPLICATIONS

This application claims priority under 35 U.S.C. § 119(e) to U.S. Provisional Patent Application Ser. No. 62/159,605, filed on May 11, 2015, and entitled, "REAL TIME DRILLING MONITORING," which is incorporated herein by reference in its entirety. This application further claims priority under 35 U.S.C. § 120 to PCT Patent Application Serial Number PCT/CN2015/078613, filed on May 8, 2015 and entitled, "REAL TIME DRILLING MONITORING," which is incorporated herein by reference in its entirety.

BACKGROUND

Computer simulation estimates the operations of a real-world system. Generally, computer simulation allows a user to test various control parameters to select an optimal control parameter. For example, in field management, computer simulation may be used to plan the drilling and production of valuable downhole assets. In particular, drilling simulation is used extensively to design drilling tools and plan for drilling operations.

SUMMARY

In general, in one aspect, embodiments relate to a method, system, and non-transitory computer readable medium for managing drilling operations. Managing drilling operations includes calibrating a drilling model using collected drilling data, and executing, during a drilling operation, a simulation on the drilling model to generate a predicted measurement value for a drilling property. During the drilling operation and from a drillstring, an actual measurement value for the drilling property is obtained. Based on the actual measurement value matching the predicted measurement value, the simulation is extended to generate a simulated state of the drilling operation during the drilling operation and a condition of the drillstring detected. A notification may be presented based on the condition during the drilling operation.

Other aspects of the technology will be apparent from the following description and the appended claims.

BRIEF DESCRIPTION OF DRAWINGS

FIGS. 1, 2, 3.1, 3.2, 4.1, and 4.2 show schematic diagrams in accordance with one or more embodiments of the technology.

FIGS. 14.2 and 16.2 show example output in accordance with one or more embodiments of the technology.

DETAILED DESCRIPTION

Figure 1:
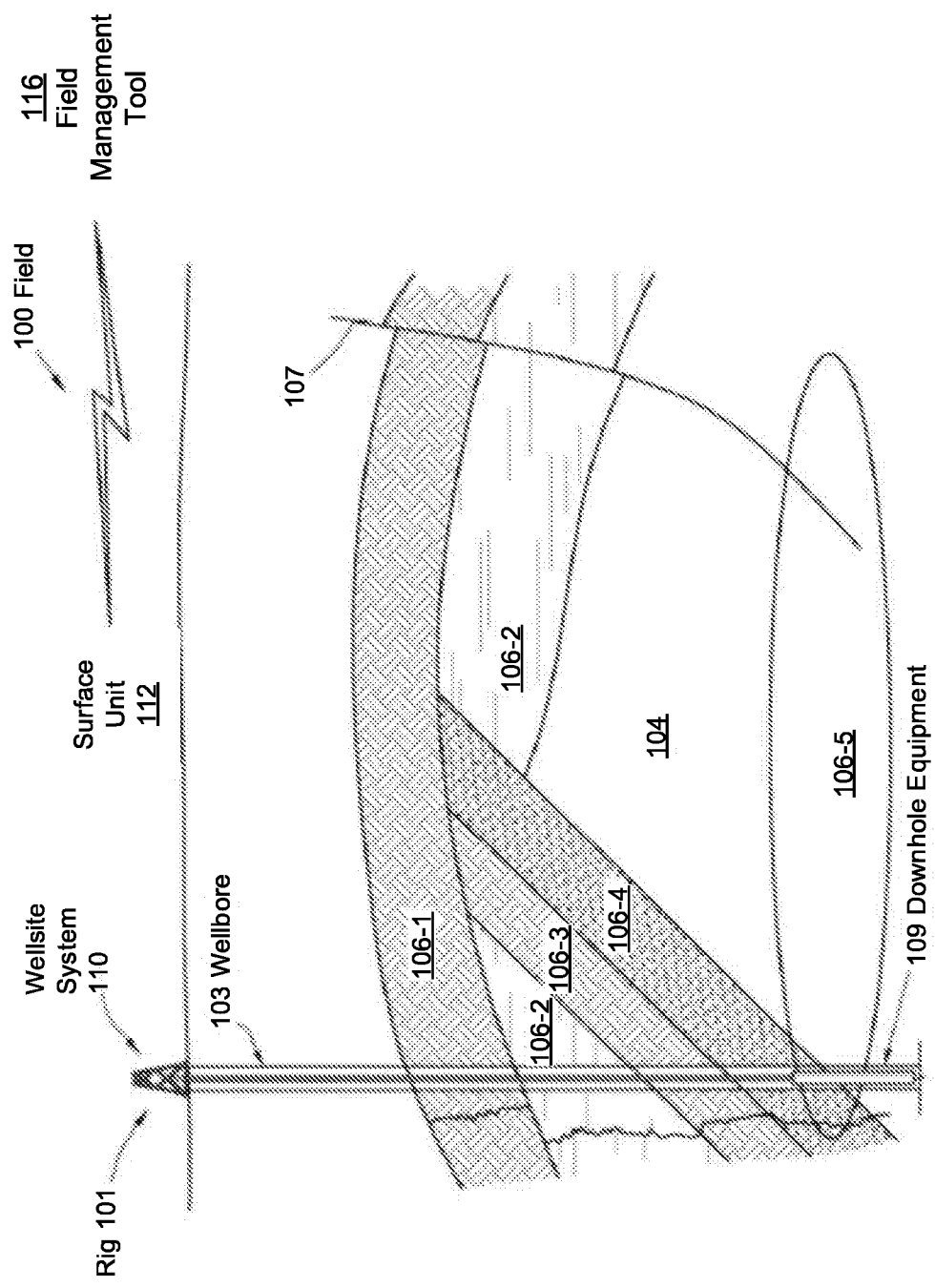

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the technology are directed to real time management of drilling operations. In particular, a drilling model is calibrated. Simulations are continually performed on using the calibrated drilling model. A predicted measurement value from the simulations is compared against an actual measurement value acquired from the field. If the actual measurement value matches the simulated measurement value, then the simulations may be used to determine a simulated state of the drilling operation. Based on the simulated state, a condition of the drilling operation is determined and a notification of the condition is presented.

One or more embodiments are directed to a drilling simulation-based real time system for drilling operation monitoring, diagnostics and optimization. Real time may refer to presenting results within a minute, within an hour, or within a day to when the drilling data is received by the simulation server depending on the type of analysis being performed. Real time may refer to presenting results within a minute, within an hour, or within a day to when the drilling data is acquired by sensors in the drilling tool. In other words, one or more embodiments may perform diagnostics and optimization for drilling. For example, one or more embodiments may perform real time vibration mitigation, real time rate of penetration (ROP) optimization, real time trajectory monitoring and directional drilling parameter recommendation, real time wellbore quality optimization, real time logging while drilling/measurement while drilling (LWD/MWD) measurement quality assurance, real time fatigue life monitoring, real time bit-reamer load balancing, real time bit and reamer wear monitoring, and real time buckling and weight on bit (WOB) transfer monitoring.

Trajectory monitoring may include ensuring that trajectory is within a threshold of the desired planned direction. Wellbore quality is the degree of smoothness and straightness of the borehole. Fatigue life managing is managing the amplitude of alternative stress on equipment, such as bending stress during the rotating of the drillstring while drilling the borehole. One or more embodiments may detect and manage the remaining amount of fatigue life of each part of equipment. Bit reamer load balancing is managing an amount of cutting force taken by the reamer as compared to the amount taken by the bit. Bit and reamer wear monitoring may include detecting and managing when the cutters go blunt. Buckling and WOB transfer monitoring may include managing actual weight transferred to bit, and preventing or managing deformation of the drill pipes.

FIG. 1 depicts a schematic view, partially in cross section, of a field (100) in which one or more embodiments may be implemented. In one or more embodiments, the field may be an oilfield. In other embodiments, the field may be a different type of field. In one or more embodiments, one or more of the modules and elements shown in FIG. 1 may be omitted, repeated, and/or substituted. Accordingly, embodiments should not be considered limited to the specific arrangements of modules shown in FIG. 1.

A subterranean formation (104) is in an underground geological region. An underground geological region is a geographic area that exists below land or ocean. In one or more embodiments, the underground geological region includes the subsurface formation in which a borehole is or may be drilled and any subsurface region that may affect the drilling of the borehole, such as because of stresses and strains existing in the subsurface region. In other words, the underground geological region may not just include the area immediately surrounding a borehole or where a borehole may be drilled, but also any area that affects or may affect the borehole or where the borehole may be drilled. As used herein, subterranean formation, formation, and subsurface formations may be used interchangeably. Further, wellbore, borehole, and hole may be used interchangeably.

As shown in FIG. 1, the subterranean formation (104) may include several geological structures (106-1 through 106-4) of which FIG. 1 provides an example. As shown, the subsurface formations may include a sandstone layer (106-1), a limestone layer (106-2), a shale layer (106-3), and a sand layer (106-4). A fault line (107) may extend through the formation. In one or more embodiments, various survey tools and/or data acquisition tools are adapted to measure the formation and detect the characteristics of the geological structures of the formation. Further, as shown in FIG. 1, the wellsite system (110) is associated with a rig (101), a wellbore (103), and other field equipment and is configured to perform wellbore operations, such as logging, drilling, fracturing, production, or other applicable operations. The wellbore (103) may also be referred to as a borehole.

In one or more embodiments, the surface unit (112) is operatively coupled to a field management tool (116) and/or the wellsite system (110). In particular, the surface unit (112) is configured to communicate with the field management tool (116) and/or the wellsite system (110) to send commands to the field management tool (116) and/or the wellsite system (110) and to receive data therefrom. For example, the wellsite system (110) may be adapted for measuring downhole properties using LWD tools to obtain well logs and for obtaining core samples. In one or more embodiments, the surface unit (112) may be located at the wellsite system (110) and/or remote locations. The surface unit (112) may be provided with computer facilities for receiving, storing, processing, and/or analyzing data from the field management tool (116), the wellsite system (110), or other part of the field (100). The surface unit (112) may also be provided with functionally for actuating mechanisms at the field (100). The surface unit (112) may then send command signals to the field (100) in response to data received, for example, to control and/or optimize various field operations described above.

During the various oilfield operations at the field, data is collected for analysis and/or monitoring of the oilfield operations. Such data may include, for example, subterranean formation, equipment, historical and/or other data. Static data relates to, for example, formation structure and geological stratigraphy that define the geological structures of the subterranean formation. Static data may also include data about the wellbore, such as well diameters, and depths. Dynamic data relates to, for example, fluids flowing through the geologic structures of the subterranean formation over time. The dynamic data may include, for example, pressures, fluid compositions (e.g. gas oil ratio, water cut, and/or other fluid compositional information), and states of various equipment, and other information.

The static and dynamic data collected from the wellbore and the oilfield may be used to create and update a three-dimensional model of the subsurface formations. Additionally, static and dynamic data from other wellbores or oilfields may be used to create and update the three-dimensional model. Hardware sensors, core sampling, and well logging techniques may be used to collect the data. Other static measurements may be gathered using downhole measurements, such as core sampling and well logging techniques. Well logging involves deployment of a downhole tool into the wellbore to collect various downhole measurements, such as density, resistivity, etc., at various depths. Such well logging may be performed using, for example, a drilling tool and/or a wireline tool, or sensors located on downhole production equipment. Once the well is formed and completed. fluid flows to the surface using production tubing and other completion equipment. As fluid passes to the surface, various dynamic measurements, such as fluid flow rates, pressure, and composition may be monitored. These parameters may be used to determine various characteristics of the subterranean formation.

In one or more embodiments, the data is received by the surface unit (112), which is communicatively coupled to the field management tool (116). Generally, the field management tool (116) is configured to analyze, model, control, optimize, or perform other management tasks of the aforementioned field operations based on the data provided from the surface unit (112). Although the surface unit (112) is shown as separate from the field management tool (116) in FIG. 1, in other examples, the surface unit (112) and the field management tool (116) may also be combined.

During a drilling operation, drilling tools are deployed from the oil and gas rigs. The drilling tools advanced into the earth along a path to locate reservoirs containing the valuable downhole assets. In one or more embodiments, the optimal path for the drilling is identified in a well plan that uses three-dimensional modeling.

Fluid, such as drilling mud or other drilling fluids, is pumped down the wellbore (or borehole) through the drilling tool and out the drilling bit. The drilling fluid flows through the annulus between the drilling tool and the wellbore and out the surface, carrying away earth loosened during drilling. The drilling fluids return the earth to the surface, and seal the wall of the wellbore to prevent fluid in the surrounding earth from entering the wellbore and causing a "blow out."

During the drilling operation, the drilling tool may perform downhole measurements to investigate downhole conditions. The drilling tool may be used to take core samples of subsurface formations. In some cases, the drilling tool is removed and a wireline tool is deployed into the wellbore to perform additional downhole testing, such as logging or sampling. Steel casing may be run into the well to a desired depth and cemented into place along the wellbore wall. Drilling may be continued until the desired total depth is reached.

After the drilling operation is complete, the well may then be prepared for production. Wellbore completion equipment is deployed into the wellbore to complete the well in preparation for the production of fluid through the wellbore. Fluid is then allowed to flow from downhole reservoirs, into the wellbore and to the surface. Production facilities are positioned at surface locations to collect the hydrocarbons from the wellsite(s). Fluid drawn from the subterranean reservoir(s) passes to the production facilities via transport mechanisms, such as tubing. Various equipment may be positioned about the oilfield to monitor oilfield parameters, to manipulate the oilfield operations and/or to separate and direct fluids from the wells. Surface equipment and completion equipment may also be used to inject fluids into reservoir either for storage or at strategic points to enhance production of the reservoir.

Sensors (S) are located about the wellsite to collect data, may be in real time, concerning the operation of the wellsite, as well as conditions at the wellsite. The sensors may also have features or capabilities, of monitors, such as cameras (not shown), to provide pictures of the operation. Surface sensors or gauges (S) may be deployed about the surface systems to provide information about the surface unit, such as standpipe pressure, hookload, depth, surface torque, rotary rotations per minute (RPM), among others. Downhole sensors or gauges (S) are disposed about the drilling tool and/or wellbore to provide information about downhole conditions, such as wellbore pressure, WOB, torque on bit, direction, inclination, collar RPM, tool temperature, annular temperature, and tool face (TF), among others. For example, the sensors may include one or more of a camera, a pressure sensor. a temperature sensor, a flow rate sensor, a vibration sensor, a current sensor, a voltage sensor, a resistance sensor, a gesture detection sensor or device, a voice actuated or recognition device or sensor, or other suitable sensors. Example downhole drillstring sensors include functionality to obtain drilling dynamics measurements, such as tri-axis accelerations, collar RPM and stick-slip, bending moment, downhole torque, and axial weight. Sensors that perform MWD and LWD may include functionality to perform caliper logging, acquire annulus pressure and equivalent circulating density (ECD) measurements, perform a well survey, acquire shock and vibration measurements, and obtain formation information at the drilling depths and ahead of a bit. The information collected by the sensors and cameras is conveyed to the various parts of the drilling system and/or the surface control unit.

At the rig floor or the surface, the sensors may include functionality to obtain input drilling parameters (e.g., surface RPM (SRPM) (actual table revolution), rotating/sliding, rotary steerable system (RSS) steering ratio and desired tool face angle (TFA), WOB and hookload, and flow rate and mud weight (MW)), surface drilling measurements (e.g., surface torque, stand pipe pressure, top drive block location/ feeding speed (ROP)), and mud logging (e.g., cuttings, and formation type and unconfined compression strength (UCS)).

Figure 2:
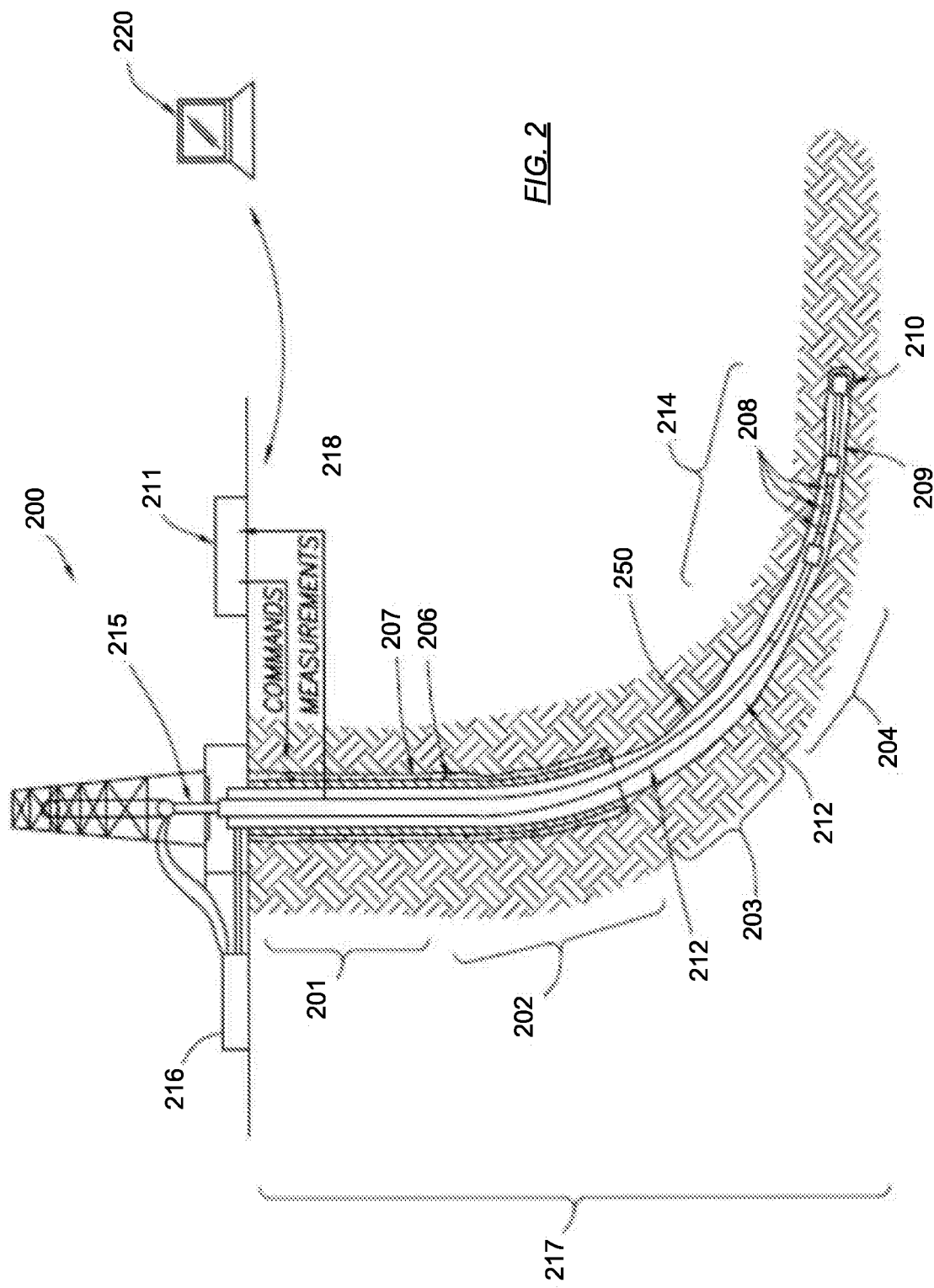

FIG. 2 shows a schematic diagram depicting a drilling operation of a directional well in multiple sections. The drilling operation depicted in FIG. 2 includes a wellsite drilling system (200) and a field management tool (220) for accessing fluid in the target reservoir through a borehole (250) of a directional well (217). The wellsite drilling system (200) includes various components (e.g., drillstring (212), annulus (212), bottom hole assembly (BHA) (214), Kelly (215), mud pit (216), etc.) as generally described with respect to the wellsite drilling systems (100) (e.g., drillstring (115), annulus (126), bottom hole assembly (BHA) (120), Kelly (116), mud pit (122), etc.) of FIG. 1 above. As shown in FIG. 2. the target reservoir may be located away from (as opposed to directly under) the surface location of the directional well (217). Accordingly, special tools or techniques may be used to ensure that the path along the bore hole (250) reaches the particular location of the target reservoir (200).

For example, the BHA (214) may include sensors (208), a rotary steerable system (209), and the bit (210) to direct the drilling toward the target guided by a pre-determined survey program for measuring location details in the well. Furthermore, the subterranean formation through which the directional well (217) is drilled may include multiple layers (not shown) with varying compositions, geophysical characteristics, and geological conditions. Both the drilling planning during the well design stage and the actual drilling according to the drilling plan in the drilling stage may be performed in multiple sections (e.g., sections (201), (202), (202), (204)) corresponding to the multiple layers in the subterranean formation. For example, certain sections (e.g., sections (201) and (202)) may use cement (207) reinforced casing (206) due to the particular formation compositions, geophysical characteristics, and geological conditions.

Further as shown in FIG. 2, surface unit (211) (as generally described with respect to the surface unit (112) of FIG. 1) may be operatively linked to the wellsite drilling system (200) and the field management tool (220) via communication links (218). The surface unit (211) may be configured with functionalities to control and monitor the drilling activities by sections in real time via the communication links (218). The field management tool (220) may be configured with functionalities to store oilfield data (e.g., historical data, actual data, surface data, subsurface data, equipment data, geological data, geophysical data, target data, anti-target data, etc.) and determine relevant factors for configuring a drilling model and generating a drilling plan. The oilfield data, the drilling model, and the drilling plan may be transmitted via the communication link (218) according to a drilling operation workflow. The communication link (218) may comprise the communication subassembly (252) as described with respect to FIG. 1 above.

To facilitate the processing and analysis of data, simulators may be used to process the data. Specific simulators are often used in connection with specific oilfield operations, such as reservoir or wellbore production. Data fed into the simulator(s) may be historical data, real time data or combinations thereof. Simulation through one or more of the simulators may be repeated or adjusted based on the data received.

The oilfield operation is provided with wellsite and non-wellsite simulators. The wellsite simulators may include a reservoir simulator, a wellbore simulator, and a surface network simulator. The reservoir simulator solves for hydrocarbon flowrate through the reservoir and into the wellbores. The wellbore simulator and surface network simulator solve for hydrocarbon flowrate through the wellbore and the surface gathering network of pipelines. As shown, some of the simulators may be separate or combined, depending on the available systems.

The non-wellsite simulators may include process and economics simulators. The processing unit has a process simulator. The process simulator models the processing plant (e.g., the process facility) where the hydrocarbon is separated into its constituent components (e.g., methane, ethane, propane, etc.) and prepared for sales. The oilfield is provided with an economics simulator. The economics simulator models the costs of part of or the entire oilfield. Various combinations of these and other oilfield simulators may be provided.

When gathering the field data, sensors might not be located along the entire length of the drillstring, but rather a few positions may have measurement values. In such a scenario, when the field management tool receives the gathered field data, the field management tool may provide an estimation as to the remaining positions. The field management tool may include functionality to generate a dynamics simulation model, calibrate and re-calibrate the model using real time data, execute the calibrated model, monitor variables through simulation, identify and warn of dangerous conditions, and explore parameters to mitigate adverse drilling dynamics. The field management tool may provide simulation results to the surface unit, which displays the simulation results and event warnings.

Variables monitoring and diagnostics may include monitoring drilling efficiency (e.g., cutting structure compatibility (bit reamer balance) and bit wear), drilling stability (e.g., vibration levels along BHA, damaging vibration mode (whirling, stick-slip), neutral point), robustness (e.g., cumulative fatigue of drillstring, drillstring buckling, and overloading detection (predicted stress versus tool strength data)), measurement quality (e.g., survey rectification accounting for BHA sag, collar lateral displacement at MWD sensors), borehole quality (e.g., hole tortuosity/hole microDLS/hole spiraling, and hole size variation), directional tendency (e.g., steering parameter sensitivity: WOB, Steering Ratio, Drilling Cycle, flow rate, sliding/rotating distance) and other aspects of drilling (e.g., motor TF rectification accounting for drillstring twist, stuck point depth estimation, and jarring impact). The system may perform warning and advising to the drilling process including, pulling out of hole (POOH) based on high cumulative fatigue and severe cutting structure wear. The system may recommend to pull off the bottom based on damaging whirling motion detected, excessive drillstring buckling detected, etc. The system may recommend a drilling parameter change based on high lateral/axial/torsional vibrations detected, poor borehole quality, challenging formation drilling (formation information based on LWD, mud logging, and the look-ahead detection of LWD), poor directional control, poor weight distribution between bit and reamer, an undesired neutral point depth, and mild drillstring buckling.

FIG. 3.1 shows an example of a communication structure in accordance with one or more embodiments of the technology. As shown in FIG. 3.1, a wellsite drilling system (310) is connected to a surface unit (304) and simulation server (308). The wellsite drilling system (310) and surface unit (304) may be the same or similar to the wellsite drilling system and surface unit discussed above with reference to FIG. 2. As shown in FIG. 3.1, downhole sensors (300) may transmit downhole data (302) via the communication link to a surface unit (304). Similarly, rig surface data (306) may also be transmitted to surface unit (304). The surface unit (304) may provide the field data (312) to a simulation server (308). The field data (312) includes rig surface data (306) and downhole data (302). The rig surface data (306) is any data that is collected from the rig surface (314). The downhole data (302) is any data collected downhole. Example rig surface data (306) and downhole data (302) may include any of the data described above with reference to FIGS. 1 and 2.

Continuing with FIG. 3.1, the simulation server (308) may execute the field management tool, discussed above. For example, the simulation server (308) may correspond to a computing system shown in FIGS. 4.1 and 4.2 and described below. As shown in FIG. 3.1, real time information in the form of the field data (312) is obtained from the wellsite as part of data acquisition and monitoring. Further, wellbore and reservoir information may be gathered. The surface unit (304) may compile the rig surface data (306) and downhole data (302) and send the field data (312) to the simulation server (308). For example, the surface unit (304) may interface with the device controller of each item of equipment to gather and compile the data from the item of the equipment.

As shown in FIG. 3.1, real time information is obtained from the wellsite as part of data acquisition and monitoring. Further, wellbore and reservoir information may be gathered. The surface unit may compile the gathered information and send the information to the simulation server. For example, the surface unit may interface with the controller for each item of equipment to gather and compile the information. When gathering the information, sensors might not be located along the entire length of the drillstring, but rather a few positions may have measurement values. In such a scenario, when the simulator receives the gathered information, the simulator may provide an estimation as to the remaining positions. The simulator may include functionality to generate a dynamics simulation model, calibrate and re-calibrate the model using real time data, execute the calibrated model, monitor variables through simulation, identify and warn of dangerous conditions, and explore parameters to mitigate adverse drilling dynamics. The simulator may provide simulation results to the surface unit, which displays the simulation results and event warnings.

FIG. 3.2 shows an example schematic diagram of a system showing flow in accordance with one or more embodiments of the technology. As shown in FIG. 3.2, at the rig site (350) of the drilling rig, drilling data may be collected (352). The drilling data (352) may be transferred (354) to remote server (356), such as the field management tool. The remote server may (356) perform real time drilling model calibration and simulation (358). Results of the simulation may be transferred (360) to the rig site (350) for display (362).

In one or more embodiments, the field management tool discussed above may be implemented as or executed on a computing system. The computing system may be a combination of mobile, desktop, server, embedded, or other types of hardware. Embodiments may be implemented on a computing system. Any combination of mobile, desktop, server, router, switch, embedded device, or other types of hardware may be used. For example, as shown in FIG. 4.1, the computing system (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), and numerous other elements and functionalities.

The computer processor(s) (402) may be an integrated circuit for processing instructions. For example, the computer processor(s) may be one or more cores or micro-cores of a processor. The computing system (400) may also include one or more input devices (410), such as a touchscreen, keyboard, mouse, microphone, touchpad, electronic pen, or any other type of input device.

The communication interface (412) may include an integrated circuit for connecting the computing system (400) to a network (not shown) (e.g., a local area network (LAN), a wide area network (WAN) such as the Internet, mobile network, or any other type of network) and/or to another device, such as another computing device.

Further, the computing system (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing systems exist, and the aforementioned input and output device(s) may take other forms.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments.

The computing system (400) in FIG. 4.1 may be connected to or be a part of a network. For example, as shown in FIG. 4.2, the network (420) may include multiple nodes (e.g., node X (422), node Y (424)). Each node may correspond to a computing system, such as the computing system shown in FIG. 4.1, or a group of nodes combined may correspond to the computing system shown in FIG. 4.1. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (400) may be located at a remote location and connected to the other elements over a network.

Although not shown in FIG. 4.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (422), node Y (424)) in the network (420) may be configured to provide services for a client device (426). For example, the nodes may be part of a cloud computing system. The nodes may include functionality to receive requests from the client device (426) and transmit responses to the client device (426). The client device (426) may be a computing system, such as the computing system shown in FIG. 4.1. Further, the client device (426) may include and/or perform at least a portion of one or more embodiments.

The field management tool may further include a data repository. A data repository is any type of storage unit and/or device (e.g., a file system, database, collection of tables, or any other storage mechanism) for storing data. Further, the data repository may include multiple different storage units and/or devices. The multiple different storage units and/or devices may or may not be of the same type or located at the same physical site.

FIGS. 5, 6, 7, 8, 9, 10, 11, 12, 13, 14.1, 15, and 16.1 show example flowcharts in accordance with one or more embodiments of the technology. While the various blocks in this flowchart are presented and described sequentially, one of ordinary skill will appreciate that some of the blocks may be executed in different orders, may be combined or omitted, and some of the blocks may be executed in parallel. Furthermore, the blocks may be performed actively or passively. For example, some blocks may be performed using polling or be interrupt driven in accordance with one or more embodiments of the technology. By way of an example, determination blocks may not require a processor to process an instruction unless an interrupt is received to signify that condition exists in accordance with one or more embodiments of the technology. As another example, determination blocks may be performed by performing a test, such as checking a data value to test whether the value is consistent with the tested condition in accordance with one or more embodiments of the technology.

Further, although the below discussion presents certain blocks as being performed by the rig computing device (or rig PC in FIGS. 6-16) and other blocks being performed by the remote server, different allocations of may be used. For example, all blocks may be performed by the remote server and none by the rig computing device, or all blocks performed by the rig computing device and none by the remote server. By way of another example, additional blocks of the figures may be performed by the rig computing device. Other allocations may be used without departing from the scope of the technology.

Figure 5:
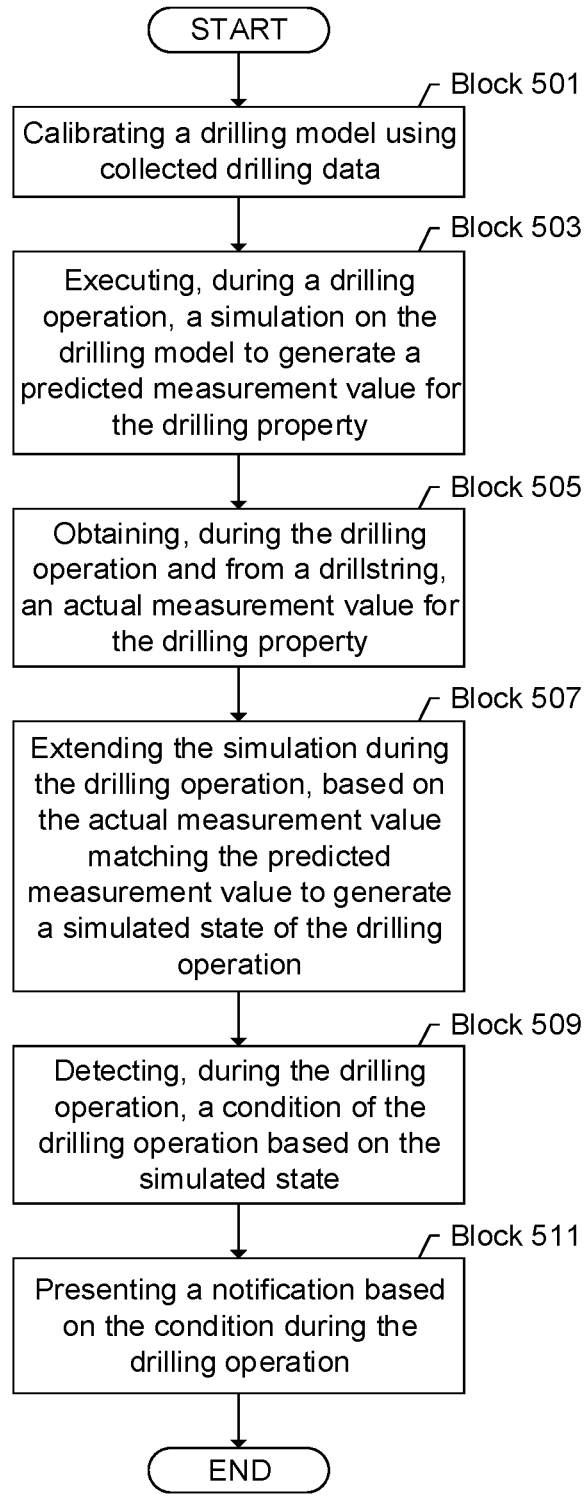
FIGS. 5, 6, 7, 8, 9, 10, 11, 12, 13, 14.1, 15, and 16.1 show flowcharts in accordance with one or more embodiments of the technology.

FIG. 5 shows an example flowchart in accordance with one or more embodiments. In Block 501, a drilling model is calibrated using collected drilling data in accordance with one or more embodiments. In one or more embodiments, downhole sensors detect various physical properties of the rocks and the state of the drillstring as downhole data and transmit the downhole data to the surface unit. Similarly, the rig surface may also collect and transmit rig surface data to the surface unit. The surface unit may send the rig surface data and the downhole data as field data to a simulation server. The simulation server may use the field data, along with detailed configuration information about the drillstring, and a subsurface model to generate a drilling model. The drilling model describes how the drillstring progresses through the subsurface formations.

In Block 503, during a drilling operation, a simulation on the drilling model is executed to generate a predicted measurement value for a drilling property. In other words, the simulation predicts how the drillstring interacts with the rock and progresses through the subsurface formation. The result of the simulation is a predicted measurement value that is for the drillstring when the drillstring is located at the current location of the drillstring or directly ahead of the current location. The measurement value may be for the same property that is being monitored (e.g., stress, buckling, rotations, etc.). In one or more embodiments, the simulation is performed by the simulation server.

In Block 505, during the drilling operation and from a drillstring, an actual measurement value is obtained for the drilling property. The actual measurement value is the actual value that is predicted in Block 503. In other words, the actual measurement value is the measurement value that is for the same location as the predicted measurement value. The actual measurement value may be obtained using a similar method discussed above with reference to Block 501, using a look ahead sensor, or another acquisition technique. The predicted measurement value and the actual measurement value may be used to determine the accuracy of the model. In other words, if the predicted measurement value matches the actual measurement value, then the drilling model is deemed accurate. A match may be deemed to exist when the predicted measurement value is an exact match to the actual measurement value, or within an error threshold to the actual measurement value.

In Block 507, the simulation is extended during the drilling operation, based on the actual measurement value matching the predicted measurement value, to generate a simulated state of the drilling operation. In other words, the drilling model that is deemed accurate is used for continued simulation of the drilling operations. As the drilling model simulates the progression of the drillstring through the borehole, the state of the drillstring is monitored in the simulations.

In Block 509, during the drilling operation, a condition of the drilling operation is detected based on the simulated state. For example, the condition may be a possible failure of the drillstring or a component of the drillstring, that the drillstring or a component of the drillstring is operating sub-optimally or another condition. In one or more embodiments, the condition may be a current condition or a future condition. For example, the future condition may be the predicted condition if drilling is maintained with the current drilling parameters.

In Block 511, a notification is presented based on the condition during the drilling operation. In one or more embodiments, the simulation server may send a communication with a notification of the condition directly or indirectly to the drilling engineer. The communication may include a recommendation to change one or more drilling parameters, to pull the drillstring out of the hole, perform another operation, or any combination thereof. In some embodiments, the simulation server may send a notification to the surface unit. The notification may include a command to change the drilling parameters, stop drilling, or perform another operation or combination thereof. The command may be processed with or without human interaction. For example, the surface unit may stop the drillstring from operating.

By performing real time simulations of the drillstring, one or more embodiments may detect present and future conditions of the drillstring even when drilling is not being performed according to the drilling plan and/or the subsurface deviates from an expected drilling environment. In other words, when the drilling being performed deviates from the drilling plan created prior to drilling and/or assumptions made during drilling are not accurate, the simulations performed prior to drilling may no longer be applicable. By providing a technique for continually updating the drilling model and executing simulations in real time, one or more embodiments may account for deviations from the drilling plan and changing assumptions.

FIGS. 6-13, 14.1, and 14.2 show example workflows for performing one or more embodiments described herein.

Figure 6:
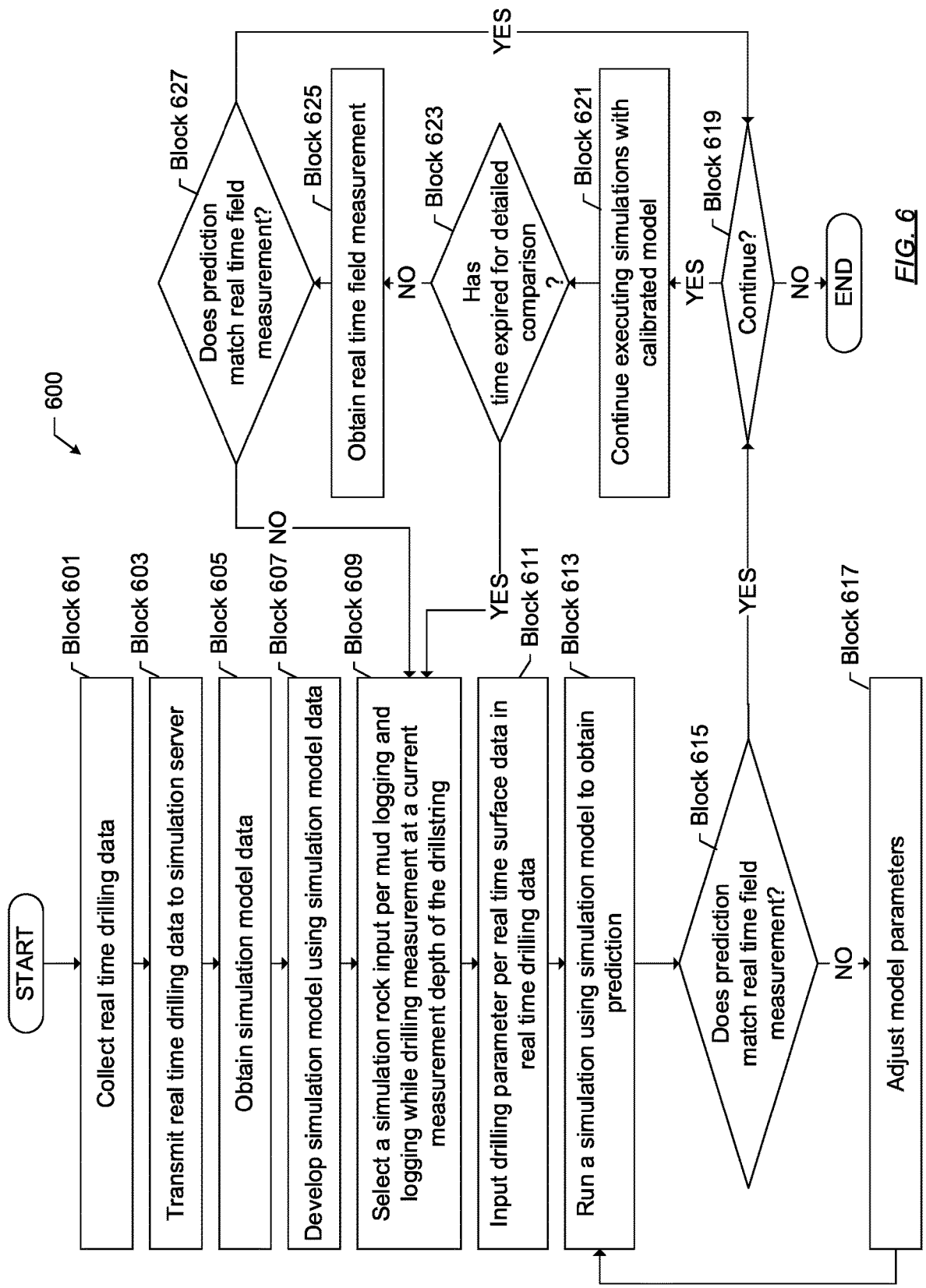

FIG. 6 shows an example flowchart (600) to calibrate a model in accordance with one or more embodiments of the technology. In Block 601, real time drilling data is collected. Collecting real time drilling data may be performed as discussed above with reference to Block 501 of FIG. 5.

In Block 603, the real time drilling data is transmitted to the simulation server in accordance with one or more embodiments. The surface unit may package and encrypt the real time drilling data. The real time drilling data may be transmitted via one or more networks to the simulation server.

In Block 605, simulation model data is obtained in accordance with one or more embodiments. In other words, the simulation server may use the real time drilling data as well as other information. For example, the simulation server may obtain detailed configuration of the drillstring, a subsurface model, and other data.

In Block 607, a simulation model is developed using the simulation model data. Developing the simulation model may be performed as discussed above with reference to Block 501 of FIG. 5.

In Block 609, at the current measurement depth of the drillstring, a simulation rock input per mud logging and a LWD measurement are selected in accordance with one or more embodiments. From the real time drilling data obtained in Block 601 for the current position of the drillstring, a simulation rock input and a measurement are selected. In one or more embodiments, the input and measurement are not used to develop the model in Block 607, but rather used to determine the accuracy of the model.

In Block 611, a drilling parameter is inputted per the real time surface data in the real time drilling data in accordance with one or more embodiments. In particular, the drilling parameter that is used to perform the current drilling is provided to the simulation model.

In Block 613, a simulation is run using the simulation model to obtain a prediction in accordance with one or more embodiments. In other words, the simulation is executed using the drilling parameter. The simulation is executed to predict the current state of the drilling using the current drilling parameters being used in the field. Running the simulation may be performed in a same or similar manner discussed above with reference to Block 503 of FIG. 5.

In Block 615, a determination is made whether the prediction matches the real time field measurement in accordance with one or more embodiments. A match may be deemed to exist when the predicted measurement value is an exact match to the real time field measurement, or within an error threshold to the real time field measurement.

In Block 615, the model parameters are adjusted if the prediction does not match the real time field measurement. Adjusting the model parameters may include perturbing one or more model parameters to vary the simulation. The amount of perturbation and the model parameter to adjust may be based, for example, on the degree of disparity between the real time field measurement and the predicted measurement. For example, the amount of perturbing and degree of disparity may be in a direct relationship whereby the greater the disparity, the greater the change of the model parameter(s). The flow may proceed to Block 613 to run the simulation. In other words, the model is calibrated based on the real time data. Further, the calibration may continually be performed throughout the drilling to ensure that the simulation model matches the actual drilling By keeping the model updated, one or more embodiments provide a technique whereby the simulations provide a more accurate prediction of the drilling.

Returning to Block 617, if the prediction matches the real time field measurement, then the flow proceeds to Block 619. In Block 619, a determination is made whether to continue. For example, the calibration may stop when the user determines to stop calibrating, drilling stops, simulations stop, etc. In such a scenario, the flow may proceed to end.

If a determination is made to continue, the flow may proceed to Block 621 in accordance with one or more embodiments. In Block 621, simulations with the calibrated model are continued to be executed in accordance with one or more embodiments. In other words, the simulations may be extended to reflect current and/or future drilling states of the drillstring. In some embodiments, different drilling scenarios are provided to the simulation server. For example, the drilling scenarios may be to adjust the drilling parameters in the drilling plan (e.g., test different weights on bit (WOB), change surface rotation speed (RPM), etc.), adjust the subsurface to account for uncertainty, or perform other changes. The different drilling scenarios may be used to predict the drilling operations when changing conditions exist, minimize risk, test changes in the drilling plans to optimize operations, etc. Because the simulation model is continuously calibrated, the result of the simulations may be deemed to be a more accurate predictor of the current and future state of the drillstring when the inputs to the simulation model exist or are performed.

In Block 623, a determination is made whether the time has expired for a detailed comparison in accordance with one or more embodiments. If the time expires for a detailed comparison, the flow returns to Block 609. In one or more embodiments, the simulation server performs a detailed comparison at a set interval. The set interval may be defined in terms of time, in terms of displacement of the drillstring, or using another unit of measurement. Thus, the time expired to perform the detailed comparison when the current interval has passed.

In Block 625, if the time has not expired for the detailed comparison then a real time field measurement is obtained in accordance with one or more embodiments. The real time drilling measurement may be obtained, directly or indirectly, from a LWD tool, a downhole sensor, the surface unit, or another component.

In Block 627, a determination is made whether the prediction from the simulation matches the real time field measurement in accordance with one or more embodiments. Determining whether the prediction matches may be performed as discussed above with reference to Block 615. If the prediction matches, the flow returns to Block 619. In other words, the simulation model may be continually used to predict the current and future states of the drillstring. If the prediction does not match, the flow goes to Block 609 to perform recalibration in accordance with one or more embodiments.

As described above and as generally shown in FIG. 6, the drilling model is calibrated to match actual drilling conditions. In one or more embodiments of the technology, using a calibrated model, during a drilling operation, a simulation on the drilling model is performed to generate a predicted measurement value for a drilling property. An actual measurement value is obtained from the sensors for the drilling property. If the actual measurement value matches the predicted measurement value from simulations, the simulation is extended during the drilling operation to generate a simulated state of the drilling operation. A condition of the drilling operation may be detected based on the simulated state and presented as discussed above. Thus, simulations may be continuously performed on a calibrated drilling model to determine the state of the drillstring and detect when a condition exists that should be rectified. Periodic recalibrations may be performed by adjusting model parameters when the predicted measurement value is not within a threshold of the actual measurement value for at least one position of the drillstring.

Figure 7:
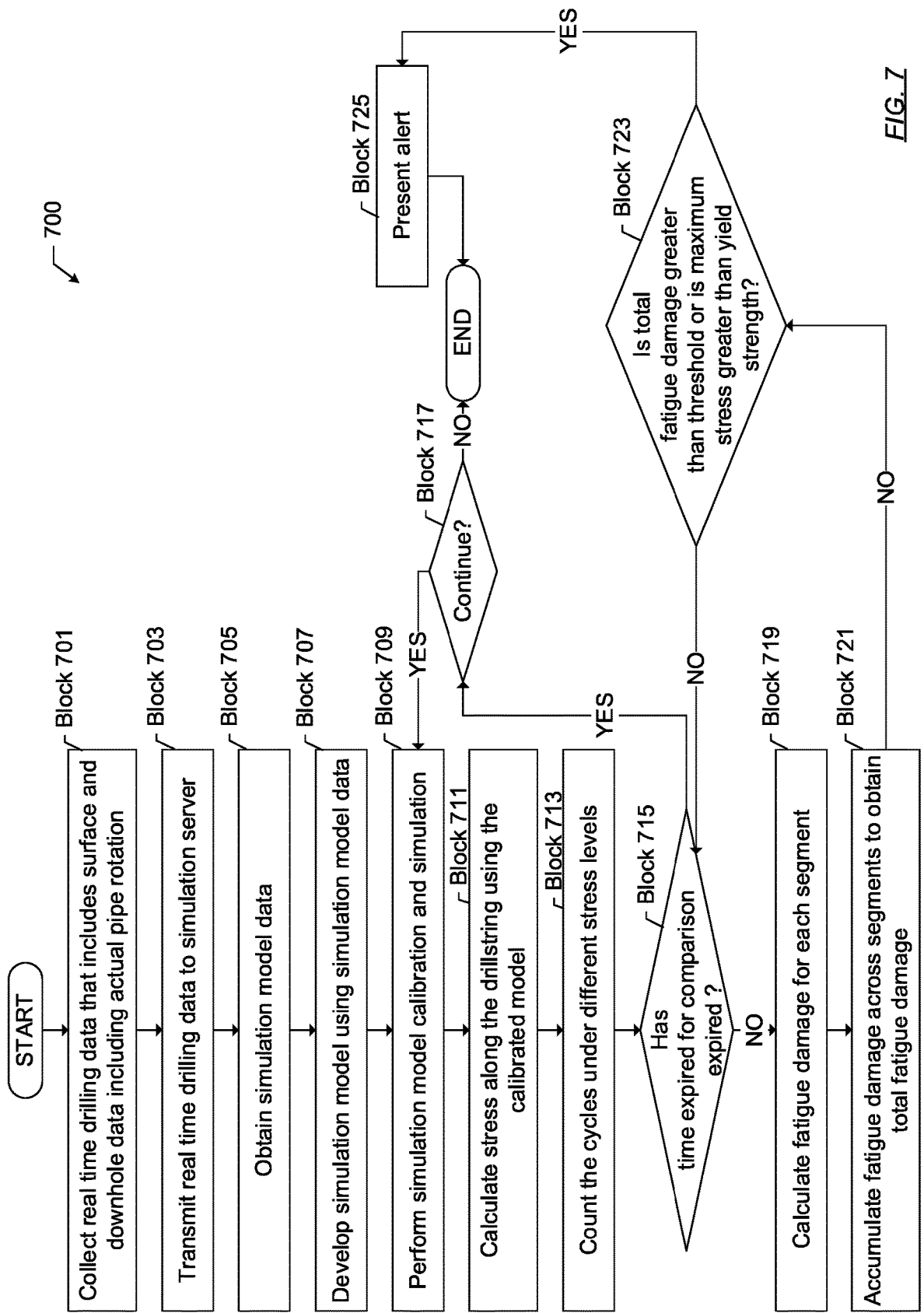

Turning to FIG. 7, FIG. 7 shows a flowchart (700) for fatigue and overloading monitoring. In FIG. 7, fatigue for a segment may refer to a particular equipment part or an entire segment of the drillstring. Maximum stress may be determined, for example, based on equipment manufacturer's guidelines. In Block 701, real time drilling data is collected that includes surface and downhole data including actual pipe rotation. Collecting the real time drilling data may be performed in a same or similar manner as discussed above with reference to Block 601 of FIG. 6.

In Block 703, the real time drilling data is transmitted to the simulation server in accordance with one or more embodiments. Transmitting the real time drilling data may be performed in a same or similar manner as discussed above with reference to Block 603 of FIG. 6.

In Block 705, simulation model data is obtained in accordance with one or more embodiments. Obtaining the simulation model data may be performed in a same or similar manner as discussed above with reference to Block 605 of FIG. 6.

In Block 707, a simulation model is developed using the simulation model data. Developing the simulation model may be performed as discussed above with reference to Block 607 of FIG. 6. The simulation model models the various conditions that may cause stress on the drillstring. For example, the simulation model may model the dimensions of the hole, the amount of rotation of different sections, interactions between the sections, as well as other aspects of the drillstring.

In Block 709, simulation model calibration and simulation is performed in accordance with one or more embodiments. The simulation model calibration and simulation may be performed as discussed above with reference to Blocks 609-617 of FIG. 6. The drilling simulation models the interaction between the drillstring and the subsurface formations. For example, the simulations may calculate the amount of whirling motion, the dimensions of the borehole, and subsequently, the amount and type of stress on each piece of equipment of the drillstring. The drilling simulation may be performed using a subsurface model of the underground formations.

In Block 711, the stress along the drillstring is calculated using the calibrated model in accordance with one or more embodiments. For each section, the stress is determined. The stress may be cyclical based on the rotation of the drillstring. For example, at a certain angle of rotation, one or more sections may have compression based stress and at another angle, the same components may have tension based stress. Other forms of stress may also exist in the drillstring. In one or more embodiments, the simulation may determine a stress value that includes bending stress amplitude and mean stress is obtained from the stress results. In other words, for each section, the stress amplitude and mean stress is obtained.

In Block 713, the cycles under different stress levels are counted in accordance with one or more embodiments. The counting is for a predefined interval of time. Counting the number of cycles may be based on the number of rotations of the drillstring and the number of cycles per rotation.

In Block 715, a determination is made whether the time has expired to perform a comparison in accordance with one or more embodiments. Block 715 may be performed in a same or similar manner discussed above with reference to Block 623 of FIG. 6. If the time expired to perform the comparison, the flow may proceed to Block 717 to determine whether to continue. For example, the determination to not continue may be performed when the user determines to stop calibrating, drilling stops, simulations stop, etc. In such a scenario, the flow may proceed to end. If a determination is made to continue, the flow may proceed to Block 709 in accordance with one or more embodiments.

Returning to Block 715, if the time has not expired for a comparison, the flow may proceed to Block 719. In Block 719, the fatigue damage is calculated for each section in accordance with one or more embodiments. Based on the amount of stress, the total amount of fatigue of the drillstring as drilling the section of wellbore may be determined.

In Block 721, the fatigue damage is accumulated across the wellbore sections to obtain an accumulative fatigue damage. The accumulation may be performed via additions, taking the maximum, or another accumulation technique.

In Block 723, a determination is made whether the total fatigue damage is greater than the threshold or whether the maximum stress is greater than the yield stress in accordance with one or more embodiments. In other words, a determination is made whether the fatigue for the drill string has accumulated sufficiently to cause a possible imminent failure of the drillstring or whether the current maximum stress may cause an imminent failure. Imminent failure is determined to exist when the failure is within a predefined configurable threshold amount of time or use of the drillstring.

If the determination is made that the total fatigue damage is greater than the threshold or the maximum stress is greater than the yield stress, the flow may proceed to Block 725 to present an alert. The alert may be presented by sending the alert via a network, displaying the alert via a display device, performing another alert presentation method, or any combination thereof. The alert may be presented with a recommendation for a drilling operation based on the alert. In one or more embodiments, a drilling operation may be performed based on the alert. For example, the drilling operation may be to modify the mud weight, change a drilling parameter of the rotation, POOH (e.g., based on the detection of imminent failure), halt drilling, continue drilling without modification of drilling parameters, perform another operation, or combination thereof. The drilling operation may be performed automatically or with human intervention. For example, the field management tool may send a command to the surface unit that automatically performs the drilling operation. By way of another example, the field management tool may generate a recommendation. For example, the recommendation may be generated by obtaining stored rules for the equipment, and performing the action in the stored rules.

By using a continually calibrated simulation model that is updated using real time drilling data, one or more embodiments provide a mechanism to warn the drilling engineers when a current or future problem exists with the drillstring.

Figure 8:
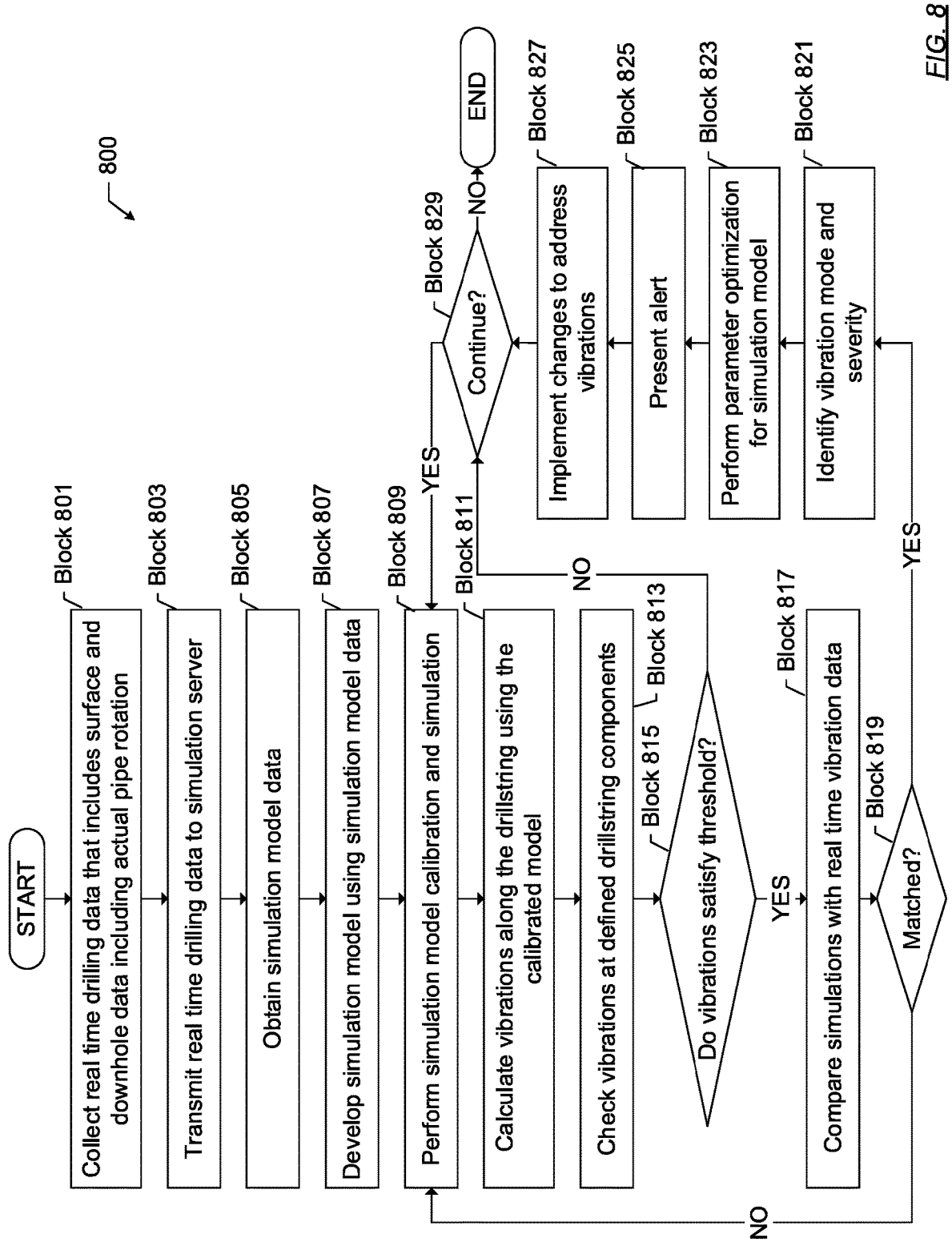

FIG. 8 shows a flowchart (800) for vibration monitoring and diagnostics in accordance with one or more embodiments of the technology. For example, the blocks in FIG. 8 may be used to monitor shock and vibration. Such shock and vibration may be caused by damaging, rolling and stick sleeve. In Block 801, real time drilling data is collected that includes surface and downhole data including actual pipe rotation. Collecting the real time drilling data may be performed in a same or similar manner as discussed above with reference to Block 601 of FIG. 6.

In Block 803, the real time drilling data is transmitted to the simulation server in accordance with one or more embodiments. Transmitting the real time drilling data may be performed in a same or similar manner as discussed above with reference to Block 603 of FIG. 6.

In Block 805, simulation model data is obtained in accordance with one or more embodiments. Obtaining the simulation model data may be performed in a same or similar manner as discussed above with reference to Block 605 of FIG. 6.

In Block 807, a simulation model is developed using the simulation model data. Developing the simulation model may be performed as discussed above with reference to Block 607 of FIG. 6. The simulation model models the various conditions that may cause vibrations of the drillstring. For example, the simulation model may model the dimensions of the hole, interactions between the drillstring and wellbore, as well as other aspects of the drillstring.

In Block 809, simulation model calibration and simulation is performed in accordance with one or more embodiments. The simulation model calibration and simulation may be performed as discussed above with reference to Blocks 609-617 of FIG. 6. The drilling simulation models the interaction between the drillstring and the subsurface formations.

In Block 811, the vibrations along the drillstring are calculated using the calibrated model in accordance with one or more embodiments. As discussed above, the simulation models the interaction between the drillstring and the subsurface formations. Thus, calculating the vibrations may be performed by analyzing the interaction from the model for the vibrations.

In Block 813, the vibrations are checked at defined drillstring components in accordance with one or more embodiments. For selected components, the simulation server obtains the calculated vibrations. The components that are selected may be configured and/or may be selected based on being possible points of failure.

In Block 815, a determination is made whether the vibrations satisfy a threshold. In other words, the determination is made whether the amount of vibration may lead to possible failure of the drillstring. If the vibrations do not satisfy a threshold, the flow may proceed to Block 829 to determine whether to continue. If the determination is made not to continue, the flow may proceed to end. If the determination is made to continue, the flow may proceed to Block 809.

Returning to Block 815, if the vibrations satisfy the threshold, then the simulations are compared to real time vibration data in accordance with one or more embodiments. In Block 817, a determination is made whether the simulations match the real time vibration data. Blocks 815 and 817 may be performed in a same or similar manner to Block 707 of FIG. 7. In other words, real time drilling measurement values of the vibrations are compared against the predicted values from the simulations. The real time measurement values of vibrations that are used for the comparison may be at a particular section of the drillstring or may not be reflective of the entire current state of the drillstring. Thus, the simulations may indicate a possible failure whereas the real time drilling data may not indicate a failure because of incompleteness of the measurements.

In Block 819, if a determination is made that the simulations do not match the real time vibration data, the flow may return to Block 809. If matched, the flow may proceed to Block 821. In Block 821, the vibration mode and severity are identified. In other words, from the simulations, the type of vibration as well as the degree of vibration for the different components of the drillstring is determined. In Block 823, parameter optimization is performed for the simulation model in accordance with one or more embodiments. In other words, the simulation is executed with different drilling parameters to determine whether a reduction of vibrations is possible.

In Block 825, an alert is presented. Further, changes may be performed based on the parameter optimization in Block 827. The changes may include changing a drilling operation based on the parameter optimization. Presenting the alert and changing the drilling operation may be performed in a same or similar manner discussed above with reference to Block 725 of FIG. 7.

Figure 9:
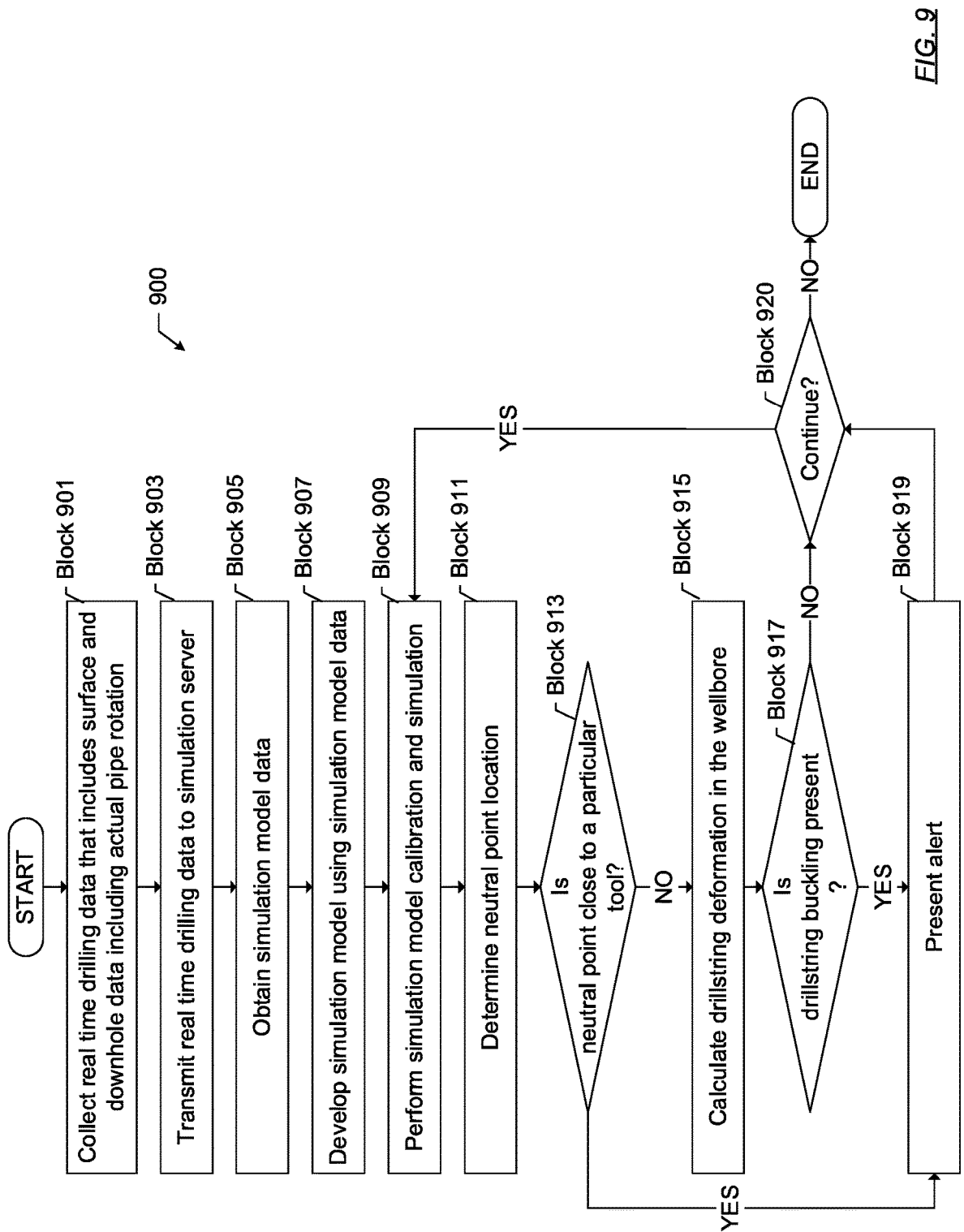

FIG. 9 shows a flowchart (900) for drillstring buckling and neutral point monitoring in accordance with one or more embodiments of the technology. In Block 901, real time drilling data is collected that includes surface and downhole data including actual pipe rotation. Collecting the real time drilling data may be performed in a same or similar manner as discussed above with reference to Block 601 of FIG. 6.

In Block 903, the real time drilling data is transmitted to the simulation server in accordance with one or more embodiments. Transmitting the real time drilling data may be performed in a same or similar manner as discussed above with reference to Block 603 of FIG. 6.

In Block 905, simulation model data is obtained in accordance with one or more embodiments. Obtaining the simulation model data may be performed in a same or similar manner as discussed above with reference to Block 605 of FIG. 6.

In Block 907, a simulation model is developed using the simulation model data. Developing the simulation model may be performed as discussed above with reference to Block 607 of FIG. 6. The simulation model models the movement of the drillstring through the borehole. Thus, buckling of the drillstring and the neutral point may be identified.

In Block 909, simulation model calibration and simulation is performed in accordance with one or more embodiments. The simulation model calibration and simulation may be performed as discussed above with reference to Blocks 609-617 of FIG. 6. The drilling simulation models the interaction between the drillstring and the subsurface formations.

In Block 911, the neutral point location is determined in accordance with one or more embodiments. Determining the neutral point location may be performed as part of determining the stresses on the drillstring. In particular, the neutral point is the point on a string of tubulars at which neither tension nor compression forces are present. Below the neutral point, compression forces may exist that build toward the bottom of the wellbore. Above the neutral point, tensile forces may exist build to a maximum applied at the hanger or as hook load. Thus, determining the neutral point may include executing the simulations to identify a current and/or future state of the drillstring including the types of stresses on the different sections of the drillstring.

In Block 913, a determination is made whether the neutral point is close to a particular tool in accordance with one or more embodiments. The neutral point is determined to be close to the particular tool when the neutral point is within a threshold distance to the tool. If the neutral point is close to the particular tool, an alert may be presented in Block 919. Further, a drilling operation may be performed. Presenting the alert and performing the drilling operation may be performed in a same or similar manner as discussed above with reference to FIG. 7.

Continuing from Block 913, in Block 915, the drillstring deformation in the wellbore is calculated in accordance with one or more embodiments. Calculating the drillstring deformation includes determining how much the drillstring changes in shape based on the stresses in the borehole. In other words, the drillstring should follow the path of the borehole linearly without any deformation. However, some deformation may be present without causing a failure of the drillstring. In Block 917, a determination is made whether buckling is present in accordance with one or more embodiments. Buckling is determined to be present when the amount of deformation is greater than a threshold. If buckling is present, then an alert is presented in Block 919. A drilling operation may be performed in accordance with one or more embodiments.

Continuing with FIG. 9, in Block 920, a determination is made whether to continue. If a determination is made not to continue, the flow may proceed to end. If the determination is made to continue, the flow may proceed to Block 909. In particular, new real time drilling data may be obtained and compared against the simulation model in order to calibrate the simulation model.

Thus, as shown in the example of FIG. 9, by continually updating and calibrating the simulation model using real time drilling data, one or more embodiments allow for a simulation based approach that is more accurate in order to monitor for drillstring failures caused by the neutral point being in a wrong location and/or drillstring deformation.

Figure 10:
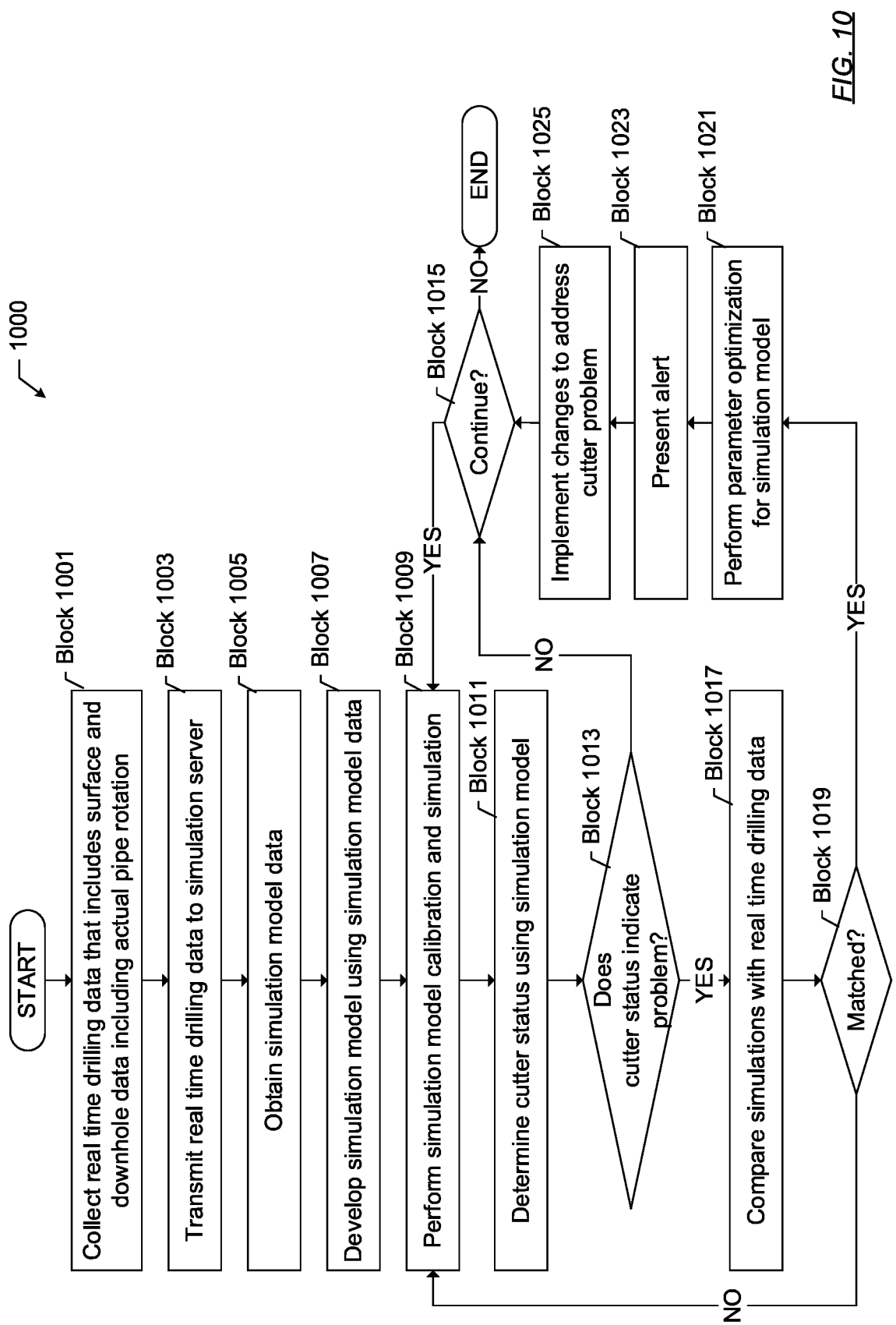

FIG. 10 shows a flowchart (1000) for cutting structure force monitoring in accordance with one or more embodiments of the technology. In Block 1001, real time drilling data is collected that includes surface and downhole data including actual pipe rotation. Collecting the real time drilling data may be performed in a same or similar manner as discussed above with reference to Block 601 of FIG. 6.

In Block 1003, the real time drilling data is transmitted to the simulation server in accordance with one or more embodiments. Transmitting the real time drilling data may be performed in a same or similar manner as discussed above with reference to Block 603 of FIG. 6.

In Block 1005, simulation model data is obtained in accordance with one or more embodiments. Obtaining the simulation model data may be performed in a same or similar manner as discussed above with reference to Block 605 of FIG. 6.

In Block 1007, a simulation model is developed using the simulation model data. Developing the simulation model may be performed as discussed above with reference to Block 607 of FIG. 6. The simulation model models the various equipment that affects and/or includes the cutters.

In Block 1009, simulation model calibration and simulation is performed in accordance with one or more embodiments. The simulation model calibration and simulation may be performed as discussed above with reference to Blocks 609-617 of FIG. 6. The simulations using the simulation model may indicate the interaction between the cutters and the subsurface formation, the change in lubrication on the cutters, the speed of the cutters, and other aspects of the drilling operations that may affect the cutters.

In Block 1011, the cutter status is determined using the simulation model. Determining the cutter status may include determining various properties of the cutter. In Block 1013, a determination is made whether the cutter status indicates a problem. If the cutter status does not indicate a problem, the flow may proceed to Block 1015 where a determination is made whether to continue. If a determination is made to continue, the flow returns to Block 1009 to perform simulation model calibration and simulation using newly acquired real time drilling data. If a determination is made to not continue the flow may proceed to end.

Returning to Block 1013, if the cutter status indicates a problem, the flow may proceed to Block 1017 to compare the simulations with the real time data. In Block 1019, a determination is made whether the simulations match the real time drilling data. Blocks 1017 and 1019 may be performed in a same or similar manner to Block 707 of FIG. 7. In other words, real time drilling measurement values of the cutter status of one or more of the cutters are compared against the predicted values from the simulations. The real time measurement values that are used for the comparison may be at a particular section of the drillstring or may not be reflective of the entire current state of the drillstring. Thus, the simulations may indicate a possible failure whereas the real time drilling data may not indicate a failure because of incompleteness of the measurements.

In Block 1021, parameter optimization is performed for the simulation model in accordance with one or more embodiments. In other words, the simulation is executed with different drilling parameters to determine whether the cutter status may be improved. In Block 1023, an alert is presented. Further, changes may be performed based on the parameter optimization in Block 1025. The changes may include changing a drilling operation based on the parameter optimization. Presenting the alert and changing the drilling operation may be performed in a same or similar manner discussed above with reference to Block 725 of FIG. 7.

Figure 11:
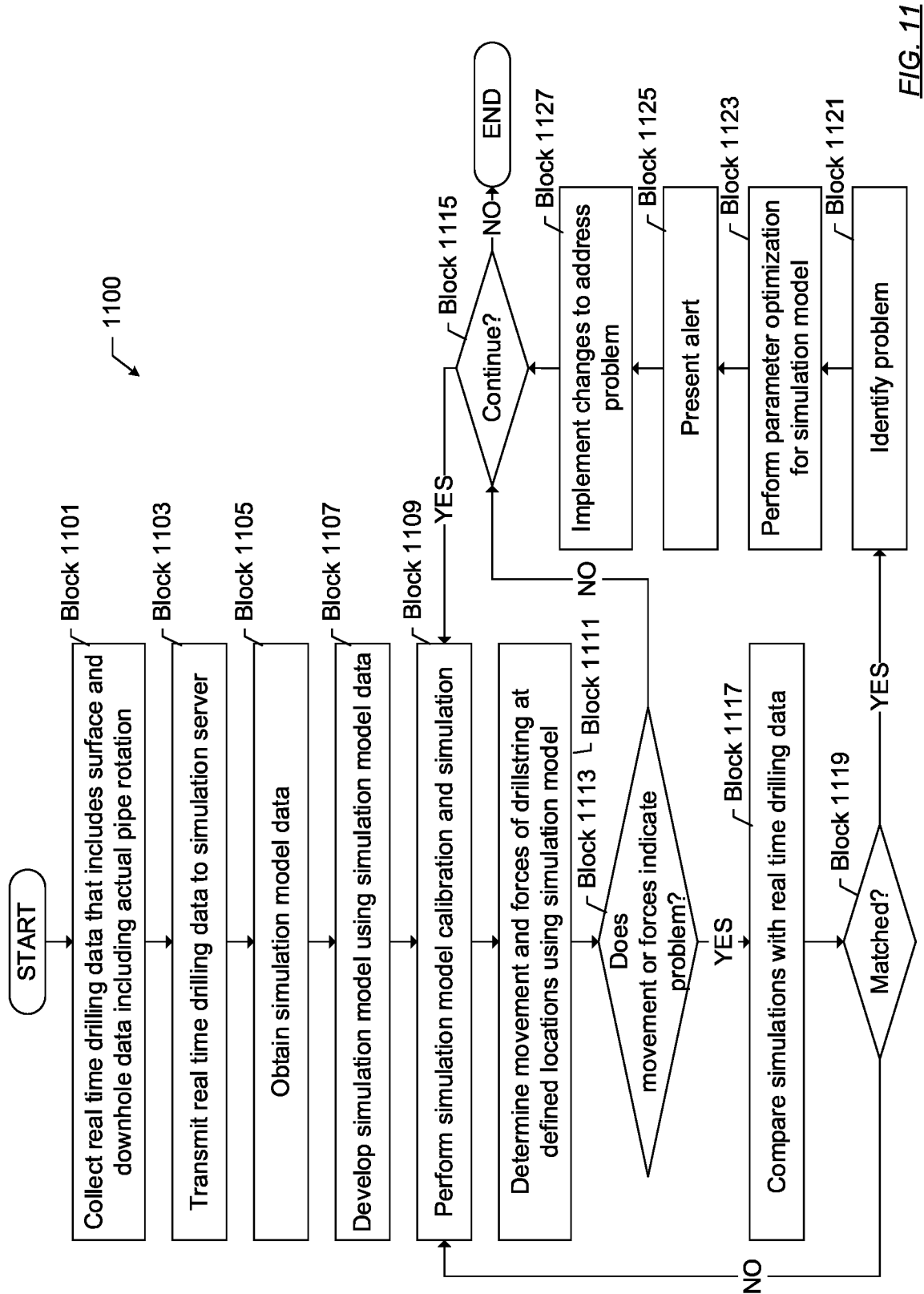

FIG. 11 shows a flowchart (1100) for measurement quality monitoring in accordance with one or more embodiments of the technology. In Block 1101, real time drilling data is collected that includes surface and downhole data including actual pipe rotation. In Block 1103, the real time drilling data is transmitted to the simulation server in accordance with one or more embodiments. In Block 1105, simulation model data is obtained in accordance with one or more embodiments. In Block 1107, a simulation model is developed using the simulation model data. The simulation model models the various equipment of the drillstring and the subsurface formations. In Block 1109, simulation model calibration and simulation are performed in accordance with one or more embodiments. The simulations using the simulation model may indicate the movement and forces of the drillstring. Blocks 1101-1109 may be performed in a same or similar manner as discussed above with reference to Blocks 1001-1009 of FIG. 10.

In Block 1111, the movement and forces of the drillstring are determined using the simulation model. In Block 1113, a determination is made whether the movement and forces indicate a problem. Determining whether the movement and forces indicate a problem may be performed by comparing output from the simulations with a rule base that relates simulation results to problem conditions. If the movement and forces do not indicate a problem, the flow may proceed to Block 1115 where a determination is made whether to continue. If a determination is made to continue, the flow returns to Block 1109 to perform simulation model calibration and simulation using newly acquired real time drilling data. If a determination is made to not continue the flow may proceed to end.

Returning to Block 1113, if the movement and/or forces indicate a problem, the flow may proceed to Block 1117 to compare the simulations with the real time data. In Block 1119, a determination is made whether the simulations match the real time drilling data. Blocks 1117 and 1119 may be performed in a same or similar manner to Block 707 of FIG. 7.

In Block 1121, the problem is identified in accordance with one or more embodiments. The problem may be identified, for example, from the rule base. In Block 1123, parameter optimization is performed for the simulation model in accordance with one or more embodiments. In other words, the simulation is executed with different drilling parameters to determine whether the problem may be mitigated. In Block 1125, an alert is presented. Further, changes may be performed based on the parameter optimization in Block 1127. The changes may include changing a drilling operation based on the parameter optimization. Presenting the alert and changing the drilling operation may be performed in a same or similar manner discussed above with reference to Block 725 of FIG. 7.

Figure 12:
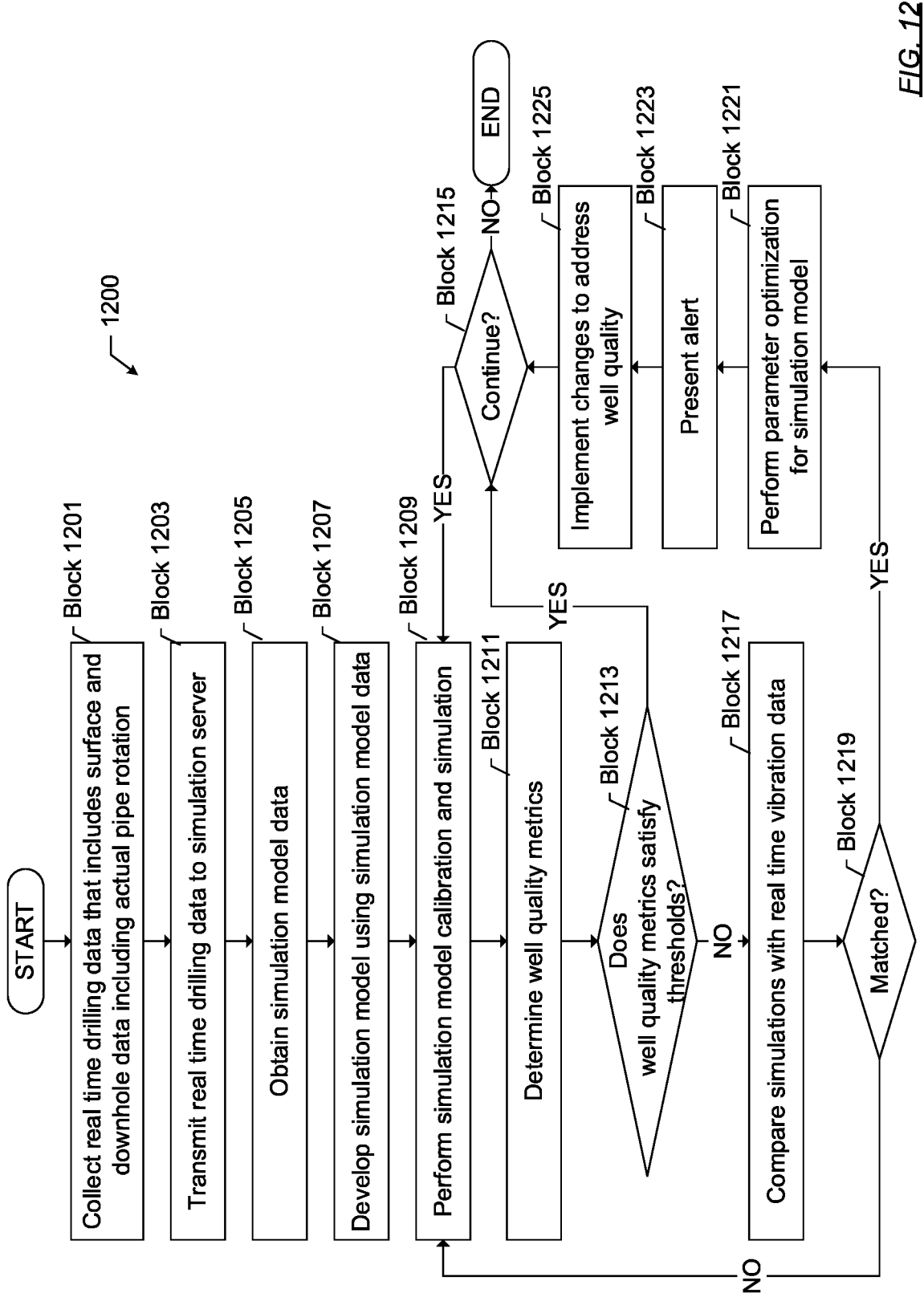

FIG. 12 shows a flowchart (1200) for borehole quality monitoring in accordance with one or more embodiments of the technology. In Block 1201, real time drilling data is collected that includes surface and downhole data including actual pipe rotation. In Block 1203, the real time drilling data is transmitted to the simulation server in accordance with one or more embodiments. In Block 1205, simulation model data is obtained in accordance with one or more embodiments. In Block 1207, a simulation model is developed using the simulation model data. The simulation model models the various equipment of the drillstring and the subsurface formations. In Block 1209, simulation model calibration and simulation are performed in accordance with one or more embodiments. The simulations using the simulation model may include how the drillstring moves through the borehole and the resulting dimensions and stability of the borehole. Blocks 1101-1109 may be performed in a same or similar manner as discussed above with reference to Blocks 1001-1009 of FIG. 10.

In Block 1211, the well quality metrics are determined using the simulation model. The well quality metrics quantify the dimensions, stability, and other properties of the borehole. Determining the well quality metrics may be performed by comparing the various properties of the borehole with a rule base that assigns a value to each property. In Block 1213, a determination is made whether the well quality metrics satisfy a threshold. If the well quality metrics satisfy a threshold, the flow may proceed to Block 1215 where a determination is made whether to continue. If a determination is made to continue, the flow returns to Block 1209 to perform simulation model calibration and simulation using newly acquired real time drilling data. If a determination is made to not continue the flow may proceed to end.

Returning to Block 1213, if the well quality metrics do not satisfy a threshold, the flow may proceed to Block 1217 to compare the simulations with the real time data. In Block 1219, a determination is made whether the simulations match the real time drilling data. Blocks 1117 and 1119 may be performed in a same or similar manner to Block 707 of FIG. 7.

In Block 1221, parameter optimization is performed for the simulation model in accordance with one or more embodiments. In other words, the simulation is executed with different drilling parameters to determine whether the well quality may be improved. For example, several simulations may be performed that each vary the weight on bit, flow rate, RPM, and other aspects of the drilling operations. In Block 1223, an alert is presented. Further, changes may be performed based on the parameter optimization in Block 1225. The changes may include changing a drilling operation based on the parameter optimization. Presenting the alert and changing the drilling operation may be performed in a same or similar manner discussed above with reference to Block 725 of FIG. 7.

Figure 13:
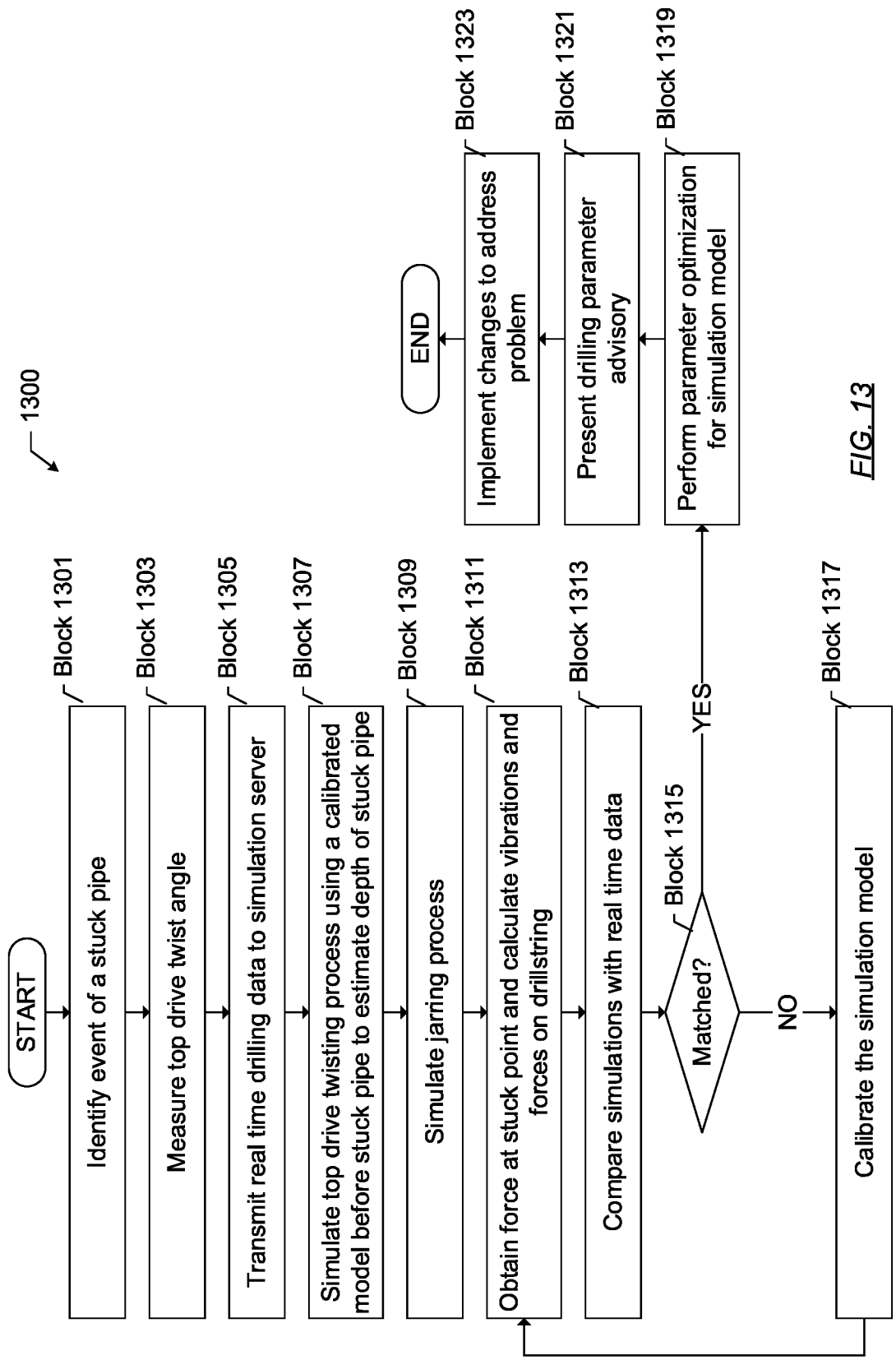

FIG. 13 shows a flowchart (1300) for jarring process monitoring in accordance with one or more embodiments of the technology. The jarring process is a process to handle a stuck pipe failure. In other words, different techniques may be performed to handle the problem when the drillstring is stuck. Some techniques may cause breakage of the drillstring. By simulating the jarring process, the drilling engineer may determine whether jarring will free the drillstring, perform nothing, or cause failure.

In Block 1301, an event of a stuck pipe is detected. For example, the surface unit may detect a stuck pipe using real time drilling data. In Block 1303, the top drive twist angle is measured. In Block 1305, real time drilling data is transmitted to the simulation server in accordance with one or more embodiments. The real time drilling data may include the data discussed above and the top drive twist angle.

In Block 1307, the top drive twisting process is simulated using a calibrated simulation model before stuck pipe to estimate depth of stuck pipe. In other words, because a human cannot see into the subsurface formation at each depth, the location of the stuck pipe may be difficult to determine One or more embodiments use a calibrated simulation model, such as discussed above with reference to FIG. 7 to determine the location.

In Block 1309, using the calibrated simulation model, the jarring process is simulated. In Block 1311, from the simulations, the force at the stuck point is obtained and the vibrations and forces along the drillstring are determined. The forces and vibrations are compared with real time drilling data in Block 1313 and a determination is made whether the simulations match the real time data in Block 1315. If the simulations do not match, the flow proceeds to Block 1317 to recalibrate the simulation model before returning to Block 1311.

If the simulations do match, the flow proceeds to Block 1319, to perform parameter optimization for the simulation model in accordance with one or more embodiments. In other words, the parameter optimization may optimize the drilling parameters when performing the jarring process. In Block 1321, a drilling parameter advisory is presented. In Block 1323, changes may be implemented to address the problem of the stuck pipe in accordance with one or more embodiments. For example, the jarring process may be performed according to the parameter optimization. By way of another example, if the determination is made that the jarring process does not improve the stuck pipe, then the other drilling operations may be performed.

Figure 14:
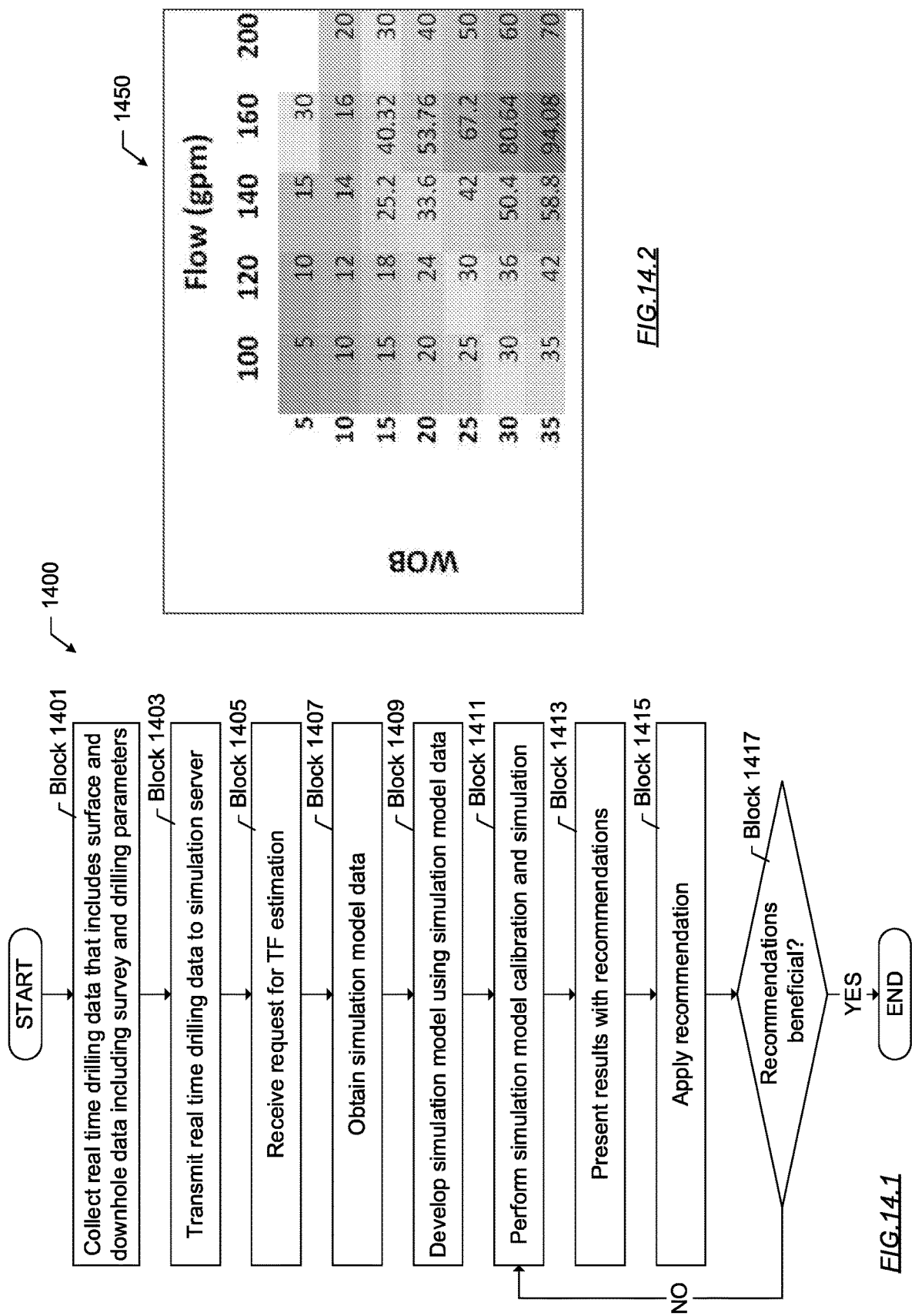

FIG. 14.1 shows a flowchart (1400) for motor tool face (TF) compensation in accordance with one or more embodiments of the technology. The objective of the motor TF compensation module is to help the directional driller (DD) choose the right tool face offset before going on bottom. DD may request help before going on bottom. While on bottom, the system may obtain actual data and calibrate the drilling model to be ready for next DD request. Output to the DD may be tool face as a function of flow and WOB.

In Block 1401, real time drilling data that includes surface and downhole data including survey and drilling parameters is collected in accordance with one or more embodiments. In Block 1403, the real time drilling data is transmitted to the simulation server. In Block 1405, a request for TF estimation is received in accordance with one or more embodiments. In Block 1407, simulation model data is obtained. In Block 1409, the simulation model is developed using the simulation model data. In Block 1411, simulation model calibration and simulation is performed. In Block 1413, the results of the simulations are presented with recommendations. In Block 1415, the recommendations are applied. In other words, a drilling operation is performed based on the recommendation. In Block 1417, a determination is made whether the recommendation is beneficial. In other words, a determination is made whether the result of performing the recommendation improved performance. If the recommendation is beneficial the flow may proceed to end. Although not shown, the flow may proceed to perform simulations using the simulation model and then performing Block 1413 to provide additional recommendations. If the recommendation is not beneficial, the simulation model may be recalibrated using new real time drilling data in Block 1411. The various blocks of FIG. 14.1 may be performed in a similar manner discussed above with reference to FIGS. 7-13.

FIG. 14.2 shows a diagram (1450) that may be presented as part of the recommendations to the drilling engineer. As shown, the diagram presents a comparison of flow to WOB. The numbers at the various positions indicate a simulated outcome when the corresponding flow and WOB are used. The greyscale encoding presents the recommended flow and WOB (e.g., WOB of 5 and flow of 100) as well as the problematic flow and WOB (e.g., WOB of 35 and flow of 160). Thus, a drilling engineer may optimize the drilling process accordingly.

Figure 15:
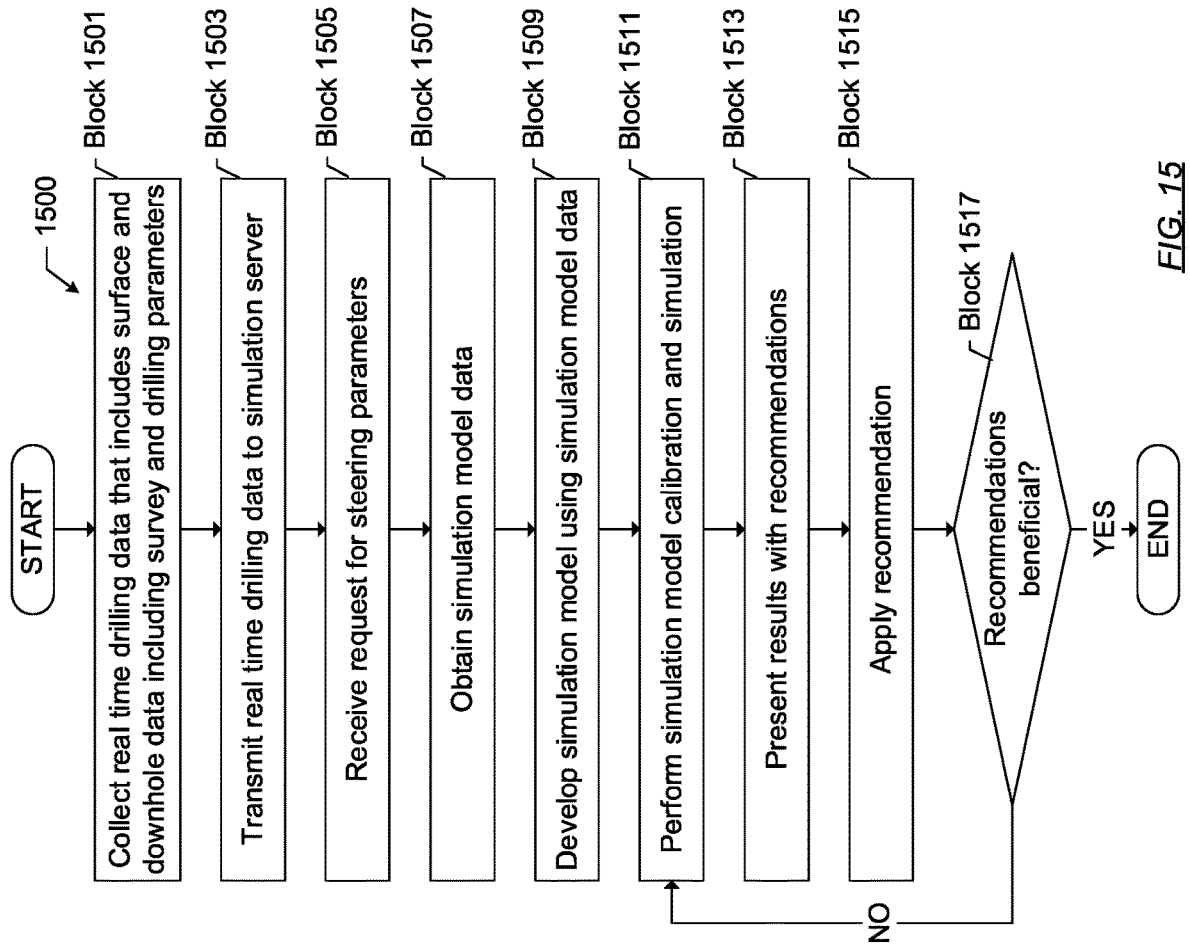

FIG. 15 shows a flowchart (1500) for steering parameter selection in accordance with one or more embodiments of the technology. Steering parameter selection may apply to RSS or motor drilling. The steering parameter selection suggests to the DD what steering parameters should be used to achieve the trajectory or DLS. The steering parameter selection may be applied in real time or at the start of each stand and may include steering parameters, such as SR steering ratio, WOB, RPM, drilling cycle, and steering vs neutral distance.

In Block 1501, real time drilling data that includes surface and downhole data including survey and drilling parameters is collected in accordance with one or more embodiments. In Block 1503, the real time drilling data is transmitted to the simulation server. In Block 1505, a request for steering parameters is received in accordance with one or more embodiments. For example, the drilling engineering may submit the request to the simulation server. In Block 1507, simulation model data is obtained. In Block 1509, the simulation model is developed using the simulation model data. In Block 1511, simulation model calibration and simulation are performed. In Block 1513, the results of the simulations are presented with recommendations. In Block 1515, the recommendations are applied. In other words, a drilling operation is performed based on the recommendation. The drilling operation includes steering the drillstring according to the steering parameters. In Block 1517, a determination is made whether the recommendation is beneficial. In other words, a determination is made whether the result of performing the recommendation improved performance. If the recommendation is beneficial the flow may proceed to end. Although not shown, the flow may proceed to perform simulations using the simulation model and then performing Block 1513 to provide additional recommendations. If the recommendation is not beneficial, the simulation model may be recalibrated using new real time drilling data in Block 1511. The various blocks of FIG. 15 may be performed in a similar manner discussed above with reference to FIG. 14.1.

FIG. 16.1 shows a flowchart (1600) for drilling parameter optimization and recommendation in accordance with one or more embodiments of the technology. In the planning phase, a drilling plan is generated. However, the drilling plan is based on a certain formation, a certain friction coefficient and steering parameters that may or may not be similar to the actual well. The drilling parameter optimization and recommendation in FIG. 16.1 is performed in real time during the drilling process. In other words, the rock parameters and friction are computed/calibrated using real time data. After calibration, the system may be used to understand the effects of changing drilling parameters.

In Block 1601, real time drilling data that includes surface and downhole data including survey and drilling parameters is collected in accordance with one or more embodiments. In Block 1603, the real time drilling data is transmitted to the simulation server. In Block 1605, simulation model data is obtained. In Block 1607, the simulation model is developed using the simulation model data. In Block 1609, simulation model calibration and simulation is performed. In Block 1611, a request for drilling parameter analysis is received. The drilling parameter analysis may be for new parameters, such as the parameters that the drilling engineer would like to submit or for current parameters. In Block 1613, simulations are executed in accordance with one or more embodiments. In Block 1615, the results of the simulations are presented. A drilling operation may be performed based on the results of the simulations. The various blocks of FIG. 16.1 may be performed in a similar manner discussed above with reference to FIG. 14.1.

FIG. 16.2 shows a possible diagram (1650) of a presentation of simulation results. As shown in FIG. 16.2, the simulation results may be presented in a similar manner as FIG. 14.2. However, a different greyscale encoding may be applied to accommodate the particular drilling engineer request. In other words, where the drilling engineer would like to optimize a particular variable (e.g., minimize risk, reduce cost, maximize recovery, etc.) the user interface that is presented to the drilling engineer may have adjusted thresholds in order to show the drilling parameters that have the optimal value of the requested variable.

Although the above figures separately describe one or more embodiments, the various above figures may be combined in virtually any manner. The various combinations are contemplated herein and do not depart from embodiments of the technology. For example, the same simulation model may be used for several of the workflows described herein.

The computing system(s) performing one or more embodiments described herein may include functionality to perform a variety of operations disclosed herein. For example, the computing system(s) may perform communication between processes on the same or a different system. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to some of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope. The processes may be part of the same or different application and may execute on the same or different computing system.

Rather than or in addition to sharing data between processes, the computing system performing one or more embodiments may include functionality to receive data from a user. For example, in one or more embodiments, a user may submit data via a graphical user interface (GUI) on the user device. Data may be submitted via the GUI by a user selecting one or more GUI widgets or inserting text and other data into GUI widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments, may extract one or more data items from the obtained data. For example, the extraction may be performed as follows by the computing system in FIG. 4.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type"). Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 4.1, while performing one or more embodiments, may perform data comparison. Data comparison may be used to compare two or more data values (e.g., A, B). For example, one or more embodiments may determine whether A>B, A=B, A!=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 4.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 4.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device. Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents a few examples of functions performed by the computing system of FIG. 4.1 and the nodes and/or client device in FIG. 4.2. Other functions may be performed using one or more embodiments.

The field management tool may further include a data repository. A data repository is any type of storage unit and/or device (e.g., a file system, database, collection of tables, or any other storage mechanism) for storing data. Further, the data repository may include multiple different storage units and/or devices. The multiple different storage units and/or devices may or may not be of the same type or located at the same physical site.

Although the preceding description has been described herein with reference to particular means, materials, and embodiments, it is not intended to be limited to the particular disclosed herein. By way of further example, embodiments may be utilized in conjunction with a handheld system (i.e., a phone, wrist or forearm mounted computer, tablet, or other handheld device), portable system (i.e., a laptop or portable computing system), a fixed computing system (i.e., a desktop, server, cluster, or high performance computing system), or across a network (i.e., a cloud-based system). As such, embodiments extend to all functionally equivalent structures, methods, uses, program products, and compositions as are within the scope of the appended claims. While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited by the attached claims.

What is claimed is:

1. A method for managing drilling operations comprising:
   calibrating a drilling model using collected drilling data;
   executing, during a drilling operation, a simulation of the drilling model to generate a predicted measurement value for a drilling property;
   obtaining, during the drilling operation and from a drillstring, an actual measurement value for the drilling property;
   comparing the actual measurement value to the predicted measurement value;
   determining that the actual measurement value matches the predicted measurement value;
   without recalibrating the model, again executing the simulation of the drilling model to generate a second predicted measurement value;
   determining that a predetermined time for a comparison between actual and predicted measurement values has not expired;
   in response to determining that the time has not expired:
     obtaining a second actual measurement value; and
     comparing the second actual measurement value with a second predicted measurement value;
   determining that the second actual measurement value does not match the second predicted measurement value;
   in response to determining that the second actual measurement value does not match the second predicted measurement value, recalibrating the drilling model;
   extending the simulation during the drilling operation, based on the actual measurement value matching the predicted measurement value, to generate a simulated state of the drillstring during the drilling operation, the simulated state of the drillstring being monitored in the extended simulation;
   determining a neutral point of the drillstring based at least partially upon the simulated state of the drillstring, wherein the drillstring experiences compression forces below the neutral point and tensile forces above the neutral point;
   determining that a distance between the neutral point and a tool coupled to the drillstring is less than a predetermined distance;
   detecting, during the drilling operation, a hazardous condition of the drilling operation based on the distance being less than the predetermined distance, wherein the condition comprises a likelihood that the tool will be damaged; and
   presenting a notification based on the condition during the drilling operation.

2. The method of claim 1, wherein detecting the condition comprises detecting vibration of the drillstring based on the simulated state of the drilling operation.

3. The method of claim 1, further comprising:
   determining, during the drilling operation, a setting for a rate of penetration of the drillstring,
   wherein presenting the notification comprises presenting the setting based on the estimated rate of penetration.

4. The method of claim 1, wherein detecting the condition comprises determining that an actual trajectory of a well bore based on the simulated state of the drilling operation fails to match a planned trajectory, and wherein the method further comprises:
   selecting a setting to adjust the actual trajectory to match the planned trajectory, wherein presenting the notification comprises presenting the setting.

5. The method of claim 1, wherein detecting the condition comprises determining that a shape of a well bore fails to satisfy a quality threshold, and wherein the method further comprises:
   selecting a setting to adjust the shape of the well bore to match the quality threshold, wherein presenting the notification comprises presenting the setting.

6. The method of claim 1, wherein detecting the condition comprises determining that a collection of drilling data fails to satisfy a quality threshold for a plurality of measurements, and wherein the method further comprises:
   selecting a setting to adjust the collection of data to satisfy the quality threshold, wherein presenting the notification comprises presenting the setting.

7. The method of claim 1, further comprising:
   calculating an estimated amount of fatigue of a part of the drillstring using the simulated state,
   wherein detecting the condition comprises
     comparing the estimated amount of fatigue with a maximal fatigue for the part to obtain a remaining life of the part, and
     determining that the remaining life fails to satisfy a threshold, and wherein presenting the notification comprises presenting an alert to rectify the part.

8. The method of claim 1, further comprising:
   determining, during the drilling operation, a bit reamer load balancing setting,
   wherein detecting the condition comprises determining that the bit reamer load balancing setting fails to satisfy a predefined threshold of bit reamer load balancing,
   wherein presenting the notification comprises presenting an alert to rectify the bit reamer load balancing setting and the drilling parameter recommendation to achieve at least the predetermined threshold of bit reamer load balancing.

9. The method of claim 1, wherein detecting the condition comprises detecting a buckling of the drillstring, and presenting the notification comprises presenting a setting to address the bucking.

10. The method of claim 1, further comprising collecting the drilling data from a plurality of sensors located along the drillstring.

11. The method of claim 1, wherein the drilling model is further calibrated with a subsurface model.

12. The method of claim 1, wherein the condition comprises vibration in the drillstring, shock in the drillstring, buckling of the drillstring, stress in the drillstring, or a combination thereof.

13. The method of claim 1, further comprising determining that the predetermined time for comparison has expired, and in response:
measuring a real-time rock parameter for a real-time drillstring position;
measuring a real-time drilling parameter for the real-time drillstring position;
recalibrating the model based in part on the real-time rock parameter and the real-time drilling parameter.

14. The method of claim 1, wherein the predetermined time is set based on chronological duration or displacement of the drillstring.

15. A system for managing drilling operations comprising:
a surface unit that:
collects an actual measurement value from a drillstring during a drilling operation, and
presents a notification based on a hazardous condition detected during the drilling operation, wherein the condition comprises a likelihood that a tool will be damaged; and
a simulation server that:
calibrates a drilling model using collected drilling data,
executes, during the drilling operation, a simulation on the drilling model to generate a predicted measurement value for a drilling property,
obtains, during the drilling operation and from the surface unit, the actual measurement value for the drilling property,
compares the actual measurement value to the predicted measurement value;
determines that the actual measurement value matches the predicted measurement value;
again executes the simulation of the drilling model to generate a second predicted measurement value, without recalibrating the model between executing and again executing;
determines that a predetermined time for a comparison between actual and predicted measurement values has not expired;
in response to determining that the time has not expired:
obtains a second actual measurement value; and
compares the second actual measurement value with a second predicted measurement value;
determines that the second actual measurement value does not match the second predicted measurement value;
in response to determining that the second actual measurement value does not match the second predicted measurement value, recalibrates the drilling model;
extends the simulation during the drilling operation, based on the actual measurement value matching the predicted measurement value, to generate the simulated state of the drillstring during the drilling operation, the simulated state of the drillstring being monitored in the extended simulation;
determines a neutral point of the drillstring based at least partially upon the simulated state of the drillstring, wherein the drillstring experiences compression forces below the neutral point and tensile forces above the neutral point;
determining that a distance between the neutral point and the tool coupled to the drillstring is less than a predetermined distance;
detects, during the drilling operation, the condition of the drilling operation based on the distance being less than the predetermined distance.

16. The system of claim 15, wherein the drillstring comprises a plurality of sensors for acquiring the actual measurement value, the drillstring for drilling a wellbore.

17. A non-transitory computer readable medium for managing drilling operations, the non-transitory computer readable medium comprising computer readable program code for:
calibrating a drilling model using collected drilling data;
executing, during a drilling operation, a simulation on the drilling model to generate a predicted measurement value for a drilling property;
obtaining, during the drilling operation and from a drillstring, an actual measurement value for the drilling property;
comparing the actual measurement value to the predicted measurement value;
determining that the actual measurement value matches the predicted measurement value;
without recalibrating the model after executing the simulation, again executing the simulation of the drilling model to generate a second predicted measurement value;
determining that a predetermined time for a comparison between actual and predicted measurement values has not expired;
in response to determining that the time has not expired:
obtaining a second actual measurement value; and
comparing the second actual measurement value with the second predicted measurement value;
determining that the second actual measurement value does not match the second predicted measurement value;
in response to determining that the second actual measurement value does not match the second predicted measurement value, recalibrating the drilling model;
extending the simulation during the drilling operation, based on the actual measurement value matching the predicted measurement value, to generate a simulated state of the drillstring during the drilling operation, the simulated state of the drillstring being monitored in the extended simulation;
determining a neutral point of the drillstring based at least partially upon the simulated state of the drillstring, wherein the drillstring experiences compression forces below the neutral point and tensile forces above the neutral point;
determining that a distance between the neutral point and a tool coupled to the drillstring is less than a predetermined distance;
detecting, during the drilling operation, a hazardous condition of the drilling operation based on the distance being less than the predetermined distance, wherein the condition comprises a likelihood that the tool will be damaged; and
presenting a notification based on the condition during the drilling operation.

18. The non-transitory computer readable medium of claim 17, wherein detecting the condition comprises detecting vibration of the drillstring based on the simulated state of the drilling operation.

19. The non-transitory computer readable medium of claim 17, further comprising computer readable program code for:
determining, during the drilling operation, an optimal setting for a rate of penetration of the drillstring,
wherein detecting the condition comprises determining that an estimated rate of penetration fails to match an actual rate of penetration, and
wherein presenting the notification comprises presenting the optimal setting for an improved rate of penetration.

20. The non-transitory computer readable medium of claim 17, wherein detecting the condition comprises determining that an actual trajectory of a well bore based on the simulated state of the drilling operation fails to match a planned trajectory, and wherein the non-transitory computer readable medium further comprises computer readable program code for:
selecting a setting to adjust the actual trajectory to match the planned trajectory, wherein presenting the notification comprises presenting the setting.

21. The non-transitory computer readable medium of claim 17, wherein detecting the condition comprises determining that a collection of drilling data fails to satisfy a quality threshold for a plurality of measurements, and wherein the non-transitory computer readable medium further comprises computer readable program code for:
selecting a setting to adjust the collection of drilling data to satisfy the quality threshold, wherein presenting the notification comprises presenting the setting.

22. The non-transitory computer readable medium of claim 17, further comprising computer readable program code for:
determining, during the drilling operation, a bit reamer load balancing setting,
wherein detecting the condition comprises determining that the bit reamer load balancing setting fails to satisfy a predefined threshold of bit reamer load balancing, and
wherein presenting the notification comprises presenting an alert to rectify the bit reamer load balancing setting and a drilling parameter recommendation to achieve the optimal load balancing.

23. The non-transitory computer readable medium of claim 17, wherein detecting the condition comprises detecting a buckling of the drillstring, and presenting the notification comprises presenting a setting to address the bucking.

* * * * *